US012089329B2

(12) United States Patent
Ryu et al.

(10) Patent No.: US 12,089,329 B2
(45) Date of Patent: Sep. 10, 2024

(54) PRINTED CIRCUIT BOARD COMPRISING VIA PORTIONS

(71) Applicant: LG INNOTEK CO., LTD., Seoul (KR)

(72) Inventors: Sung Wuk Ryu, Seoul (KR); Seung Yul Shin, Seoul (KR); Joon Wook Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 198 days.

(21) Appl. No.: 17/756,958

(22) PCT Filed: Nov. 27, 2020

(86) PCT No.: PCT/KR2020/017090
§ 371 (c)(1),
(2) Date: Jun. 6, 2022

(87) PCT Pub. No.: WO2021/112499
PCT Pub. Date: Jun. 10, 2021

(65) Prior Publication Data
US 2022/0418106 A1     Dec. 29, 2022

(30) Foreign Application Priority Data

Dec. 4, 2019   (KR) ........................ 10-2019-0159974
Dec. 4, 2019   (KR) ........................ 10-2019-0159997

(51) Int. Cl.
*H05K 1/11*      (2006.01)
*H05K 1/02*      (2006.01)

(52) U.S. Cl.
CPC ........... *H05K 1/112* (2013.01); *H05K 1/0298* (2013.01); *H05K 2201/0195* (2013.01); *H05K 2201/096* (2013.01)

(58) Field of Classification Search
CPC .... H05K 1/112; H05K 3/4644; H05K 1/0298; H05K 2201/0196; H05K 2201/10098; H05K 2201/0195; H05K 2201/096
(Continued)

(56) References Cited

U.S. PATENT DOCUMENTS 7,834,273 B2   11/2010   Takahashi et al.
8,673,744 B2   3/2014    Nakamura et al.
(Continued)

FOREIGN PATENT DOCUMENTS

JP   11-233674 A    8/1998
JP   2005-123397 A  5/2005
(Continued)

OTHER PUBLICATIONS

Office Action dated Feb. 24, 2022 in Korean Application No. 10-2019-0159997.
(Continued)

*Primary Examiner* — Timothy J Thompson
*Assistant Examiner* — Michael F McAllister
(74) *Attorney, Agent, or Firm* — Saliwanchik, Lloyd & Eisenschenk

(57) ABSTRACT

A printed circuit board according to an embodiment includes a first insulating layer; a second insulating layer disposed on the first insulating layer; a first via portion disposed in the first insulating layer; and a second via portion disposed in the second insulating layer; wherein the first via portion includes: a first via part passing through the first insulating layer; a first-first pad disposed on an upper surface of the first insulating layer and connected to an upper surface of the first via part; and a first-second pad disposed on a lower surface of the first insulating layer and connected to a lower surface of the first via part; wherein the second via portion includes: a second via part passing through the second insulating layer and having a lower surface connected to an upper surface of the first-first pad; a second pad disposed on an upper surface of the second insulating layer and connected to an upper surface of the second via part; wherein a width of the first-first pad is smaller than or equal to a width of the upper surface of the first via part; and wherein a width of the second pad is smaller than or equal to a width of the upper surface of the second via part.

13 Claims, 13 Drawing Sheets

(58) Field of Classification Search
USPC .......................................................... 174/262
See application file for complete search history.

(56) References Cited

U.S. PATENT DOCUMENTS

| | | | | |
|---|---|---|---|---|
| 2003/0135994 | A1* | 7/2003 | Shutou | H05K 3/0032 29/830 |
| 2007/0096328 | A1* | 5/2007 | Takahashi | H05K 3/00 257/774 |
| 2009/0001550 | A1* | 1/2009 | Li | H05K 3/422 257/E23.005 |
| 2015/0245486 | A1* | 8/2015 | Shin | H01L 23/3677 174/251 |
| 2017/0094797 | A1* | 3/2017 | Baek | H05K 3/4697 |

FOREIGN PATENT DOCUMENTS

| | | |
|---|---|---|
| JP | 2015-18988 A | 1/2015 |
| JP | 5652481 B2 | 1/2015 |
| KR | 10-2005-0036367 A | 4/2005 |
| KR | 10-2007-0070225 A | 7/2007 |
| KR | 10-2009-0097721 A | 9/2009 |
| KR | 10-2011-0083506 A | 7/2011 |
| KR | 10-1613525 B1 | 4/2016 |
| KR | 10-2016-0097799 A | 8/2016 |
| KR | 10-2018-0082282 A | 7/2018 |
| WO | 2012/108381 A1 | 8/2012 |

OTHER PUBLICATIONS

Office Action dated May 25, 2022 in Korean Application No. 10-2019-0159997.
Office Action dated Jul. 29, 2021 in Korean Application No. 10-2019-0159997.
International Search Report dated Mar. 16, 2021 in International Application No. PCT/KR/2020/017090.
Office Action dated Apr. 25, 2024 in Korean Application No. 10-2019-0159974.

* cited by examiner (a)

(b)

(a)

(b)

(a)

(b)

PRINTED CIRCUIT BOARD COMPRISING VIA PORTIONS

CROSS-REFERENCE TO RELATED APPLICATIONS

This application is the U.S. national stage application of International Patent Application No. PCT/KR2020/017090, filed Nov. 27, 2020, which claims the benefit under 35 U.S.C. § 119 of Korean Application Nos. 10-2019-0159974, filed Dec. 4, 2019; and 10-2019-0159997, filed Dec. 4, 2019; the disclosures of each of which are incorporated herein by reference in their entirety.

TECHNICAL FIELD

An embodiment relates to a printed circuit board and a method of manufacturing the same.

BACKGROUND ART

As miniaturization, weight reduction, and integration of an electronic component are accelerated, a line width of a circuit has been miniaturized. In particular, as a design rule of a semiconductor chip is integrated on a nanometer scale, a circuit line width of a package substrate or a printed circuit board on which the semiconductor chip is mounted has been miniaturized to several micrometers or less.

Various methods have been proposed in order to increase the degree of circuit integration of the printed circuit board, that is, to reduce the circuit line width. For the purpose of inhibiting loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for miniaturizing the circuit pitch.

Meanwhile, recently, in order to meet a demand for wireless data traffic, efforts have been made to develop an improved 5G (5th generation) communication system or a pre-5G communication system. Here, the 5G communication system uses ultra-high frequency (mmWave) bands (sub 6 GHz, 28 GHz, 38 GHz, or higher frequencies) to achieve high data transfer rates.

In addition, in order to reduce a path loss of radio waves and increase a transmission distance of radio waves in the ultra-high frequency band, in the 5G communication system, integration technologies such as beamforming, massive multi-input multi-output (massive MIMO), and array antennas have been developed. Considering that it may be composed of hundreds of active antennas of wavelengths in the frequency bands, an antenna system becomes large relatively.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

And, the printed circuit board applied to the 5G communication system as described above is manufactured according to the trend of light, thin and compact, and accordingly, the circuit pattern is gradually becoming finer.

However, the printed circuit board of the prior art has a significantly reduced design freedom due to the pad connected to the via, which has a problem in that the RF performance is also reduced in the 5G NR era.

Therefore, a new technology for miniaturization and thinning of semiconductor package technology is required in accordance with the 5G era.

DISCLOSURE

Technical Problem

The embodiment provides a printed circuit board having a novel structure and a method for manufacturing the same.

In addition, the embodiment provides a printed circuit board including a via portion, in which a via and a pad directly connected to the via have the same width, and a method of manufacturing the same.

In addition, the embodiment provides a printed circuit board including a via portion having a width of a via greater than a width of a pad directly connected to the via, and a method of manufacturing the same.

In addition, the embodiment provides a printed circuit board having a structure in which a plurality of via portions directly connected to each other in a multilayer stack structure are aligned on one vertical line, and a method for manufacturing the same.

In addition, the embodiment provides a printed circuit board having a zigzag structure in which a plurality of via portions directly connected to each other in a multilayer stack structure are not aligned on one vertical line and are shifted, and a method of manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A printed circuit board according to an embodiment includes a first insulating layer; a second insulating layer disposed on the first insulating layer; a first via portion disposed in the first insulating layer; and a second via portion disposed in the second insulating layer; wherein the first via portion includes: a first via part passing through the first insulating layer; a first-first pad disposed on an upper surface of the first insulating layer and connected to an upper surface of the first via part; and a first-second pad disposed on a lower surface of the first insulating layer and connected to a lower surface of the first via part; wherein the second via portion includes: a second via part passing through the second insulating layer and having a lower surface connected to an upper surface of the first-first pad; a second pad disposed on an upper surface of the second insulating layer and connected to an upper surface of the second via part; wherein a width of the first-first pad is smaller than or equal to a width of the upper surface of the first via part; and wherein a width of the second pad is smaller than or equal to a width of the upper surface of the second via part.

In addition, each of the first via part and the second via part includes an upper surface having a first width and a lower surface having a second width smaller than the first width.

In addition, each of the first-first pad and the second pad has a third width smaller than the first width or the second width.

In addition, the upper surface of the first via part includes: a first region in contact with a lower surface of the second insulating layer, and a second region in contact with a lower surface of the second pad.

In addition, the upper surface of the first via part includes a third region in contact with the upper surface of the second via part.

In addition, the printed circuit board of claim further includes a third insulating layer disposed under the first insulating layer; and a third via portion disposed in the third insulating layer; wherein the third via portion includes: a third pad disposed on a lower surface of the third insulating layer; and a third via part disposed in the third insulating layer and having a lower surface connected to an upper surface of the third pad and an upper surface connected to the first-second pad.

In addition, the first-second pad has a second width or a third width smaller than the second width.

In addition, the lower surface of the first via part includes: a first region in contact with an upper surface of the third insulating layer; a second region in contact with the upper surface of the third pad; a third region in contact with the upper surface of the third via part.

In addition, the second insulating layer and the third insulating layer include a photo-curable resin (PID: Photo-imageable dielectics).

In addition, the first insulating layer is a thermosetting resin.

In addition, a center of each of the first-first pad, the first-second pad, the first via part, the second via part, the second pad, the third via part, and the third pad is aligned on the same one vertical line.

On the other hand, a manufacturing method of the printed circuit board according to the embodiment includes preparing a first insulating layer; forming a first via hole in the first insulating layer; forming a first via portion filling the first via hole in the first insulating layer; forming a second insulating layer on an upper surface of the first insulating layer and forming a third insulating layer below a lower surface of the first insulating layer; forming a second via hole in the second insulating layer and forming a third via hole in the third insulating layer; and forming a second via part filling the second via hole in the second insulating layer and forming a third via part filling the third via hole in the third insulating layer; wherein the first via portion includes: a first via part passing through the first insulating layer; a first-first pad disposed on an upper surface of the first insulating layer and connected to an upper surface of the first via part; and a first-second pad disposed on a lower surface of the first insulating layer and connected to a lower surface of the first via part; wherein the second via portion includes: a second via part passing through the second insulating layer and having a lower surface connected to an upper surface of the first-first pad; a second pad disposed on an upper surface of the second insulating layer and connected to an upper surface of the second via part; wherein the third via portion includes: a third pad disposed on a lower surface of the third insulating layer; and a third via part disposed in the third insulating layer and having a lower surface connected to an upper surface of the third pad and an upper surface connected to the first-second pad; wherein a width of the first-first pad is smaller than or equal to a width of the upper surface of the first via part; wherein a width of the second pad is smaller than or equal to a width of the upper surface of the second via part, and wherein the third pad is smaller than or equal to a width of a lower surface of the third via part.

In addition, each of the first via part and the second via part includes an upper surface having a first width and a lower surface having a second width smaller than the first width, and wherein the third via part includes an upper surface having the second width and a lower surface having the first width.

In addition, each of the first-first pad and the second pad has a third width smaller than the first width or the second width, and wherein the first-second pad has the second width or a third width smaller than the second width.

In addition, the upper surface of the first via part includes: a first region in contact with a lower surface of the second insulating layer, a second region in contact with a lower surface of the second pad, and a third region in contact with the upper surface of the second via part.

In addition, the lower surface of the first via part includes: a first region in contact with an upper surface of the third insulating layer; a second region in contact with the upper surface of the third pad; a third region in contact with the upper surface of the third via part.

In addition, the second insulating layer and the third insulating layer include a photo-curable resin (PID: Photo-imageable dielectics), and the first insulating layer is a thermosetting resin.

In addition, a center of each of the fir-first pad, the first-second pad, the first via part, the second via part, the second pad, the third via part, and the third pad is aligned on the same one vertical line.

The printed circuit board according to the embodiment includes a first insulating layer; a second insulating layer disposed on the first insulating layer; a first via portion disposed in the first insulating layer; and a second via portion disposed in the second insulating layer; and wherein the first via portion includes a first via part passing through the first insulating layer; a first-firs pad disposed on an upper surface of the first insulating layer, connected to an upper surface of the first via part, and having a width equal to or smaller than a width of the upper surface of the first via part; and first-second pad disposed on a lower surface of the first insulating layer and connected to a lower surface of the first via part; wherein the second via portion includes a second via part disposed through the second insulating layer and having a lower surface connected to the upper surface of the first-first pad; a second pad disposed on an upper surface of the second insulating layer, connected to an upper surface of the second via part, and having a width equal to or smaller than a width of the upper surface of the second via part; wherein a first virtual vertical line passing through a center of the first via portion is spaced apart from a second virtual vertical line passing through a center of the second via portion in a horizontal direction.

In addition, a virtual vertical line passing through each center of the first-first pad, the first-second pad, and the first via part is aligned on the first vertical line, and wherein a virtual vertical line passing through center of the second pad and the second via part is aligned on the second vertical line.

In addition, the first vertical line includes a first-first virtual vertical line passing through the center of the first-first pad or the first-first pad; and a first-second vertical line passing through the center of the first via part and spaced apart from the first-first vertical line in a horizontal direction.

In addition, the second vertical line includes a second-first virtual vertical line passing through the center of the second pad; and a second-second vertical line passing through the center of the second via part and spaced apart from the second-first vertical line in a horizontal direction.

In addition, each of the first via part and the second via part includes an upper surface having a first width and a lower surface having a second width smaller than the first width, and each of the first-first pad and the second pad has a third width smaller than the first width or the second width.

In addition, the upper surface of the first via part includes a first region in contact with a lower surface of the second insulating layer; a second region in contact with a lower surface of the second pad; and a third region in contact with an upper surface of the second via part.

In addition, the printed circuit board further includes a third insulating layer disposed under the first insulating layer; and a third via portion disposed in the third insulating layer; wherein the third via portion may include a third pad disposed on a lower surface of the third insulating layer; and a third via part disposed in the third insulating layer and having a lower surface connected to an upper surface of the third pad and an upper surface connected to the first-second pad; wherein a third virtual vertical line passing through a center of the third via part is spaced apart from at least one of the first vertical line and the second vertical line in a horizontal direction.

In addition, the first-second pad has the second width or a third width smaller than the second width.

In addition, the lower surface of the first via part includes a first region in contact with an upper surface of the third insulating layer; a second region in contact with the upper surface of the third pad; and a third region in contact with an upper surface of the third via part.

In addition, the second insulating layer and the third insulating layer include a photo-curable resin (PID: Photo-imageable dielectrics), and the first insulating layer is a thermosetting resin.

Advantageous Effects

According to an embodiment, each via portion interconnected in the printed circuit board having a multilayer structure includes a via part passing through an insulating layer and a pad disposed on one surface of the via part. In this case, in the printed circuit board according to the embodiment, the width of the pad is not greater than the width of the one surface of the via part. In other words, the width of the pad of each via portion included in the printed circuit board may be equal to or smaller than the width of one surface of the via part.

According to this, the printed circuit board of the embodiment can increase a separation distance between the plurality of via portions, and accordingly, it is easy to implement a fine pattern of the circuit pattern, so that the circuit density can be increased.

In addition, the embodiment can improve the design freedom of the overall printed circuit board according to the design change of the via portion, and accordingly, it is possible to secure a fine pattern implementation and substrate reliability.

In an embodiment, the centers of the via portions directly connected to each other in the vertical direction may be arranged to be aligned on the same vertical line, or alternatively, may be arranged in a zigzag manner so as to be shifted from each other. Here, the aligned or zigzag portion may be the via part of each via portion, or alternatively, may be the pad of each via portion, or alternatively, may be both the via part and the pad of each via portion. According to this, the shape or position of the via portion can be freely changed according to the design of the circuit pattern required in the printed circuit board including the via portion, and accordingly, the degree of design freedom can be improved.

BEST MODE

Figure 1:
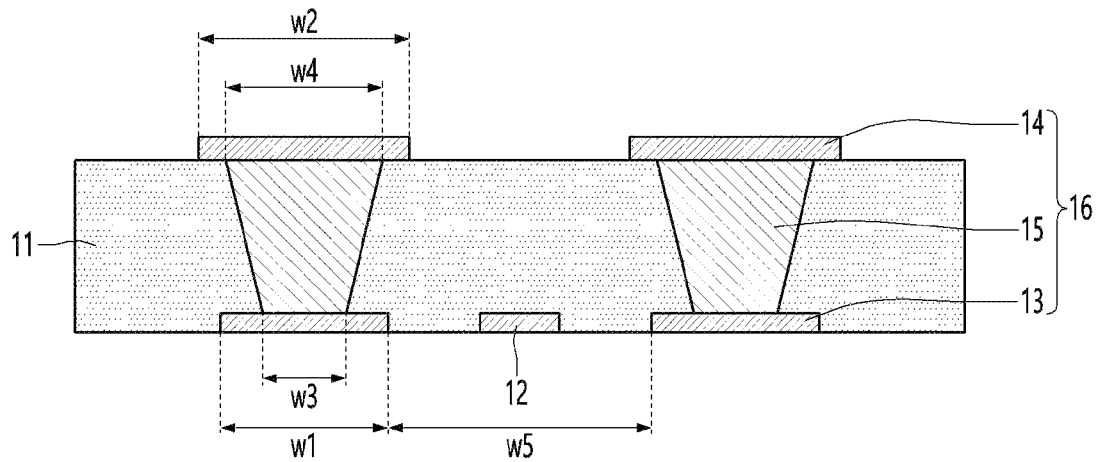
FIG. 1 is a view showing a printed circuit board according to a comparative example.
Figure 1:
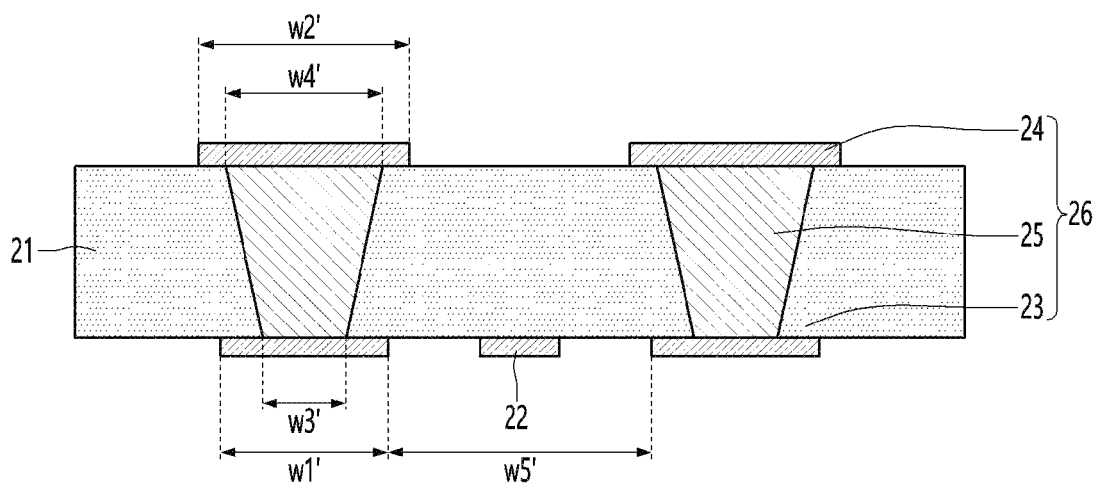

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

As used herein, the singular forms "a," "an" and "the" are intended to include the plural forms as well, unless the context clearly indicates otherwise.

It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Hereinafter, an embodiment of the present invention will be described in detail with reference to the accompanying drawings.

FIG. 1 is a view showing a printed circuit board according to a comparative example. FIG. 1 (a) is a view showing a printed circuit board including a buried circuit pattern manufactured by a ETS method, and FIG. 1 (b) is a view showing a printed circuit board including a general protruding circuit pattern.

Referring to FIG. 1 (a), a printed circuit board according to a comparative example includes a circuit pattern manufactured by an ETS method.

Specifically, the printed circuit board manufactured by the ETS method includes an insulating layer 11, a circuit pattern 12, and a via portion 16. At this time, although it is illustrated that the circuit pattern 12 is disposed only under the insulating layer 11 in the drawing, the circuit pattern is substantially additionally disposed with a protruding structure on an upper surface of the insulating layer 11.

The circuit pattern 12 is embedded in the insulating layer 11.

Preferably, the circuit pattern 12 is buried in a lower region of the insulating layer 11. Accordingly, a lower surface of the circuit pattern 12 is disposed on the same plane as a lower surface of the insulating layer 11.

An upper circuit pattern (not shown) is additionally disposed on an upper surface of the insulating layer 11, and the upper circuit pattern has a structure protruding above the upper surface of the insulating layer 11.

A via portion 16 is disposed in the insulating layer 11.

At this time, the via part 15 includes a via part 15 disposed in the insulating layer 11 and passing through the insulating layer 11, a first pad 13 buried in the lower region of the insulating layer 11, and a second pad 14 disposed on the upper surface of the insulating layer 11.

In this case, the first pad 14 has a first width w1, and the second pad 15 has a second width w2. The first width w1 may be the same as the second width w2, and differently, it is smaller than the second width w2.

In addition, the lower surface of the via part 15 is in contact with the upper surface of the first pad 13 and has a third width w3. In addition, the upper surface of the via part 15 is in contact with a lower surface of the second pad 14 and has a fourth width w4. In this case, the third width w3 is smaller than the fourth width w4, and accordingly, the via part 15 has a shape in which the width gradually decreases from an upper portion to the lower portion.

Meanwhile, the third width w3 of the lower surface of the via part 15 is smaller than the first width w1 of the first pad 13. In addition, the fourth width w4 of the upper surface of the via part 15 is smaller than the second width w2 of the second pad 14. That is, the first pad 13 and the second pad 14 have a structure extending from each of the upper and lower portions of the via part 15 in the horizontal direction.

Meanwhile, in recent years, circuit patterns have been gradually refined. And, in the case of a fine circuit pattern having a width/interval of 15 μm/15 μm or less, an outermost layer must be implemented by the ETS method. That is, in the case of a fine circuit pattern in which the circuit pattern of the outermost layer has a width of 15 μm and each circuit pattern is spaced apart by an interval of 15 μm or less, a stable fine circuit pattern can be formed only when the circuit pattern is formed by the ETS method.

However, in the printed circuit board in the comparative example as described above, the first width w1 of the first pad 13 is greater than the third width w3 of the lower surface of the via part 15, and the second width w2 of the second pad 14 is greater than the fourth width w4 of the upper surface of the via part 15. Accordingly, a separation distance between the adjacent via portions is reduced. In other words, in the printed circuit board in the comparative example, the separation distance w5 between the adjacent first pads 13 may be reduced.

In other words, in the printed circuit board of the comparative example, the spacing between the first pads 13 is smaller than the spacing between lower regions of the adjacent via parts.

Referring to FIG. 1 (b), a printed circuit board according to a comparative example includes a circuit pattern having a protruding structure.

Specifically, the printed circuit board includes an insulating layer 21, a circuit pattern 22, and a via portion 26. At this time, although it is illustrated that the circuit pattern 22 is disposed only under the insulating layer 21 in the drawing, the circuit pattern is substantially additionally disposed on the upper surface of the insulating layer 21 having a protruding structure.

*The circuit pattern 22 has a structure protruding under a lower surface of the insulating layer 21. Accordingly, an upper surface of the circuit pattern 22 is disposed on the same plane as the lower surface of the insulating layer 21.

A via portion 26 is disposed in the insulating layer 21.

In this case, the via portion 26 includes a via part 25 disposed in the insulating layer 21 and passing through the insulating layer 21, a first pad 23 protruding under the lower surface of the insulating layer 21, and a second pad 24 disposed on the upper surface of the insulating layer 21.

In this case, the first pad 24 has a first width w1', and the second pad 25 has a second width w2'. The first width w1' may be the same as the second width w2', and differently, it is smaller than the second width w2'.

In addition, a lower surface of the via part 25 contacts the upper surface of the first pad 23 and has a third width w3 In addition, an upper surface of the via part 25 is in contact with the lower surface of the second pad 24 and has a fourth width w4 In this case, the third width w3' is smaller than the fourth width w4', and accordingly, the via part 25 has a shape in which the width gradually decreases from an upper portion to a lower portion.

Meanwhile, the third width w3' of the lower surface of the via part 25 is smaller than the first width w1' of the first pad 23. In addition, the fourth width w4' of the upper surface of the via part 25 is smaller than a second width w2' of the second pad 24. That is, the first pad 23 and the second pad 24 have a structure extending each of the upper portion and the lower portion of the via part 25 in the horizontal direction.

In the printed circuit board in the comparative example as described above, the first width w1' of the first pad 23 is larger than the third width w3' of the lower surface of the via part 25, and the second width w2' of the second pad 24 is greater than the fourth width w4' of the upper surface of the via part 25. Accordingly, the separation distance between the adjacent via portions is reduced. In other words, in the printed circuit board in the comparative example, the separation distance w5' between the adjacent first pads 23 may be reduced.

In addition, as 5G technology develops, interest in printed circuit boards that can reflect this is increasing. At this time, in order for 5G technology to be applied, the printed circuit board must have a high multi-layer structure, and accordingly, the circuit pattern should be miniaturized. However, in the comparative example, although it is possible to form a fine pattern due to the structure of the via portion as described above, there is a problem in that the circuit density in the space between the via portions decreases.

Figure 2:
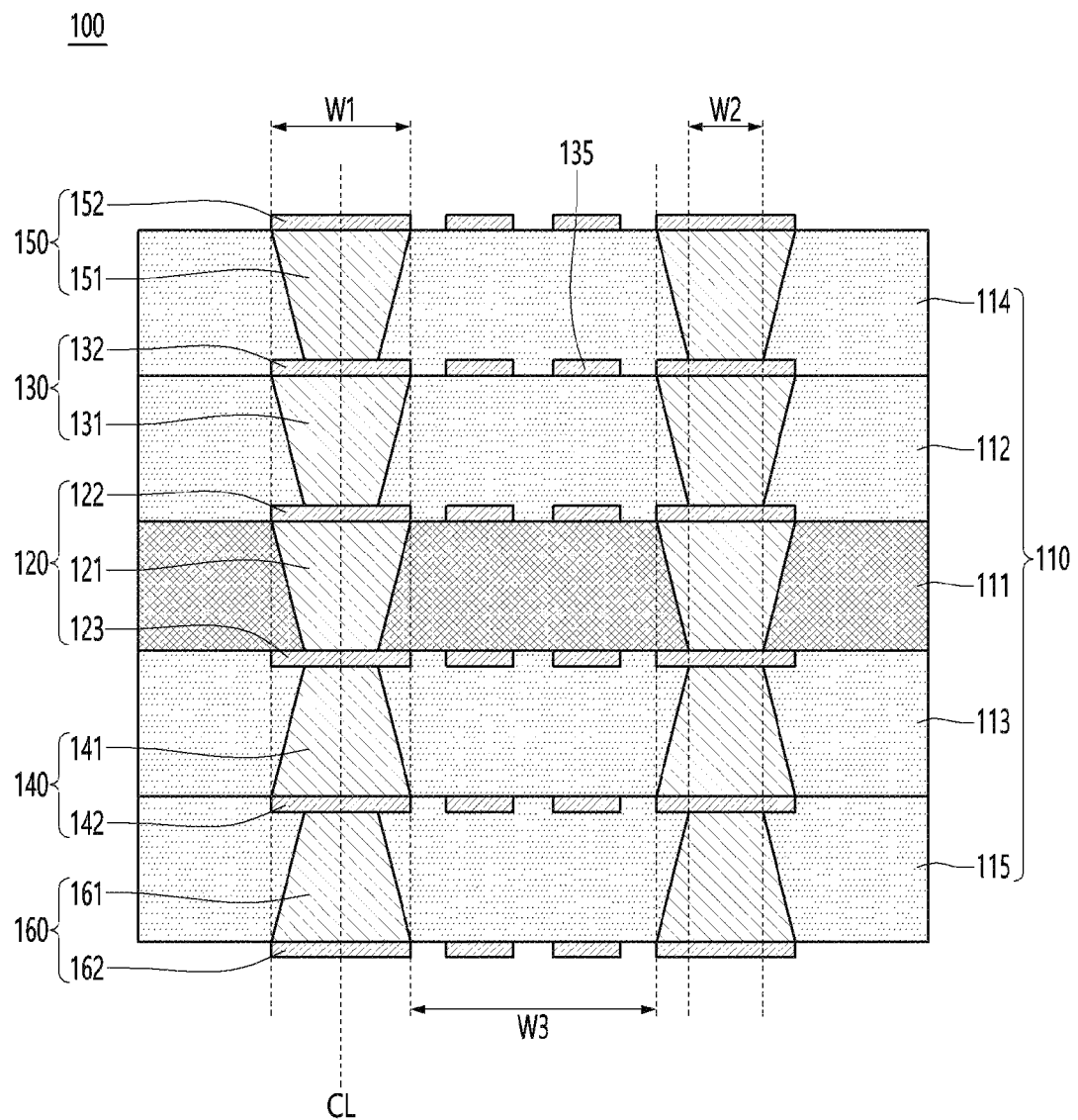
FIG. 2 is a view showing a printed circuit board according to a first embodiment.
Figure 3:
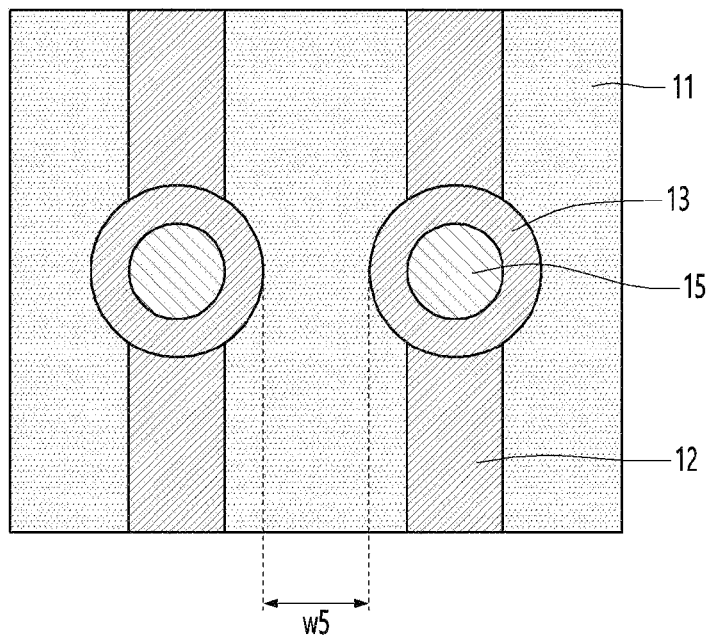
FIG. 3 is a view comparing separation distances between a plurality of via portions in the printed circuit boards of the comparative example and the first embodiment.
Figure 3:
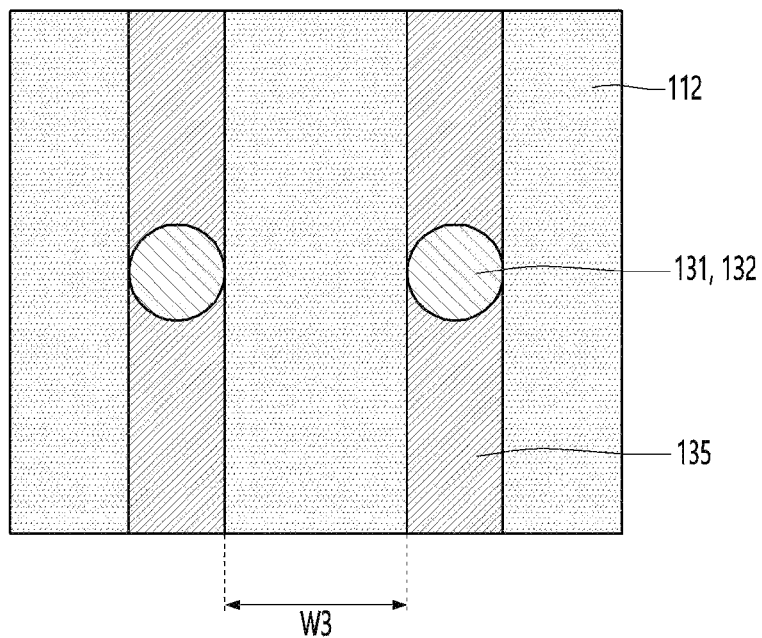

FIG. 2 is a view showing a printed circuit board according to a first embodiment, and FIG. 3 is a view comparing separation distances between a plurality of via portions in the printed circuit boards of the comparative example and the first embodiment.

Referring to FIGS. 2 and 3, the printed circuit board 100 includes an insulating layer 110, via portions 120, 130, 140, 150, 160, and a circuit pattern 135.

At this point, the printed circuit board 100 may form a wiring layout for electrical wirings which connect circuit components based on a circuit design, and electrical conductors may be disposed on an insulating material. Further, electrical components may be mounted on the printed circuit board 100, and the printed circuit board 100 may form wirings configured to connect the electrical components to make a circuit, and may mechanically fix the components besides functioning to electrically connect the components.

The insulating layer 110 may have a plurality of stacked structures. Preferably, the insulating layer 110 may include a first insulating layer 111, a second insulating layer 112, a third insulating layer 113, a fourth insulating layer 114, and a fifth insulating layer 115.

The first insulating layer 111 may be a central insulating layer positioned at a center of the insulating layers 110 having a plurality of stacked structures. The first insulating layer 111 may be a core insulating layer. However, this is only an embodiment, and the printed circuit board 100 may be a coreless substrate, and thus the first insulating layer 111 may be a general insulating layer.

The first insulating layer 111 may be rigid or flexible. For example, the first insulating layer 111 may include glass or plastic. Specifically, the first insulating layer 111 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the first insulating layer 111 may include an optically isotropic film. As an example, the first insulating layer 111 may include cyclic olefin copolymer (COC), cyclic olefin polymer (COP), optically isotropic PC, optically isotropic polymethylmethacrylate (PMMA), or the like.

In addition, the first insulating layer 111 may be partially bent while having a curved surface. That is, the first insulating layer 111 may partially have a plane and may partially be bent while having a curved surface. Specifically, an end portion of the first insulating layer 111 may be bent while having a curved surface, or bent or crooked while having a surface with a random curvature.

In addition, the first insulating layer 111 may be a flexible substrate having flexibility. Further, the first insulating layer 111 may be a curved or bent substrate. At this point, the first insulating layer 111 may form a wiring layout for electrical wirings which connect circuit components based on a circuit design, and electrical conductors may be disposed on an insulating material. Further, electrical components may be mounted on the first insulating layer 111, and the first insulating layer 111 may form wirings configured to connect the electrical components to make a circuit, and may mechanically fix the components besides functioning to electrically connect the components.

The second insulating layer 112 may be disposed on an upper surface of the first insulating layer 111.

The third insulating layer 113 may be disposed under a lower surface of the first insulating layer 111.

The fourth insulating layer 114 may be disposed on an upper surface of the second insulating layer 112.

The fifth insulating layer 115 may be disposed under a lower surface of the third insulating layer 113.

The second insulating layer 112, the third insulating layer 113, the fourth insulating layer 114, and the fifth insulating layer 115 may include a photocurable resin or a photosensitive resin. That is, the second insulating layer 112, the third insulating layer 113, and the fourth insulating layer may be formed of a PID (Photoimageable Dielectrics) material.

To this end, the second insulating layer 112, the third insulating layer 113, the fourth insulating layer 114, and the fifth insulating layer 115 include an epoxy resin, a photo initiator, a silicon-based filler, and a curing agent and the like. For example, the second insulating layer 112, the third insulating layer 113, the fourth insulating layer 114, and the fifth insulating layer 115 may be formed by laminating a photocurable resin film or applying a photocurable resin paste or liquid. In this case, in one example, the photocurable resin material may include any one or more selected from Photocurable polyhydroxystyrene (PHS), photocurable polybenzoxazole (PBO), photocurable polyimide (PI), photocurable benzocyclobutene (BCB), photocurable polysiloxane, photocurable epoxy and novolac resin.

In the embodiment, the second insulating layer 112, the third insulating layer 113, the fourth insulating layer 114, and the fifth insulating layer 115 are formed of a photocurable resin, so that a fine circuit pattern having a small size and a fine via portion may be formed using exposure and development, and the like.

Meanwhile, circuit patterns (not shown) are formed on the surfaces of the first insulating layer 111, the second insulating layer 112, the third insulating layer 113, the fourth insulating layer 114, and the fifth insulating layer 115. This can be arranged. At this time, in the drawing, reference numerals are given only to the circuit pattern 135 disposed on the upper surface of the second insulating layer 112.

The circuit pattern may be manufactured using an Embedded Trace Substrate (ETS) method to have a structure buried in the first insulating layer 111, the second insulating layer 112, the third insulating layer 113, the fourth insulating layer 114, and the fifth insulating layer 115. However, the embodiment is not limited thereto, the circuit pattern can be formed by Additive process, Subtractive Process, Modified Semi Additive Process (MSAP), and SAP (Semi Additive Process) method, which is a typical manufacturing process of a printed circuit board, so as to have a structure protruding above the surface of each insulating layer, and a detailed description thereof will be omitted herein.

Meanwhile, the circuit pattern may be a wiring for transmitting an electrical signal, and may be formed of a metal material having high electrical conductivity. For this, the circuit pattern may be formed of at least one metal material selected from among gold (Au), silver (Ag), platinum (Pt), titanium (Ti), tin (Sn), copper (Cu), and zinc (Zn). In addition, the circuit pattern may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the circuit pattern may be formed of copper (Cu) having high electrical conductivity and a relatively low cost.

Meanwhile, a via portion may be disposed in each insulating layer.

The first via portion 120 is disposed in the first insulating layer 111. The first via portion 120 includes a first via part 121 that passes through the first insulating layer 111 and first pads 122 and 123 disposed on each of the upper and lower surfaces of the first insulating layer 111 and connected to the first via part 121.

The via part 121 may be formed by filling the inside of a first via hole VH1 passing through the first insulating layer 111 with a conductive material.

The first via hole TH1 may be formed by any one of machining methods, including mechanical, laser, and chemical machining. When the through hole is formed by machining, methods such as milling, drilling, and routing can be used, and when the through hole is formed by laser processing, a UV or $CO_2$ laser method can be used, and when the through hole is formed by chemical processing, drugs including aminosilanes, ketones, etc. may be used, and accordingly, the first insulating layer 111 may be opened.

On the other hand, the processing by the laser is a cutting method in which optical energy is concentrated on the surface to melt and evaporate a part of the material to take a desired shape, and it can easily process complex formations by computer programs, and can process composite materials that are difficult to cut by other methods.

In addition, the processing by the laser can have a cutting diameter of at least 0.005 mm, and has a wide advantage in a range of possible thicknesses.

As the laser processing drill, it is preferable to use a YAG (Yttrium Aluminum Garnet) laser, a $CO_2$ laser, or an ultraviolet (UV) laser. The YAG laser is a laser that can process both the copper foil layer and the insulating layer, and the $CO_2$ laser is a laser that can process only the insulating layer.

When the first via hole TH1 is formed, the first via part 121 may be formed by filling the inside of the through hole with a conductive material. Metal materials forming the vias V1, V2, V3, V4, V5, V6, and V7 may be any one material selected from copper (Cu), silver (Ag), tin (Sn), gold (Au), nickel (Ni) and palladium (Pd), and the conductive material may be filled by any one of electroless plating, electrolytic plating, screen printing, sputtering, evaporation, ink-jetting, and dispensing.

In this case, the first via hole VH1 formed in the first insulating layer 111 in the embodiment may be formed in a different method from the via holes VH2, VH3, VH4, and VH5 formed in the other insulating layers 112, 113, 114, and 115. That is, the other insulating layers 112, 113, 114, and 115 excluding the first insulating layer 111 are formed of a photosensitive material, and accordingly, the via holes VH2, VH3, VH4, and VH5 may be formed through processes such as exposure and development. On the other hand, the first insulating layer 111 may be formed of a material different from that of the second to fifth insulating layers 112, 113, 114, and 115. Accordingly, the second to fifth via holes VH2, VH3, VH4, and VH5 may be formed by any one processing method among mechanical, laser, and chemical processing, which is different from that of the second to fifth via holes VH2, VH3, VH4, and VH5. However, the embodiment is not limited thereto, and the first via hole VH1 may be formed in the same method as the second to fifth via holes VH2, VH3, VH4, and VH5.

First pads 122 and 123 may be disposed on the upper and lower surfaces of the first insulating layer 111.

Preferably, the first-first pad 122 connected to the upper surface of the first via part 121 may be disposed on the upper surface of the first insulating layer 111. The first-first pad 122 may be one of a plurality of circuit patterns disposed on the upper surface of the first insulating layer 111.

Also, a first-second pad 123 connected to a lower surface of the first via part 121 may be disposed on a lower surface of the first insulating layer 111. The first-second pad 123 may be one of a plurality of circuit patterns disposed on the lower surface of the first insulating layer 111.

The width of the upper surface and the lower surface of the first via part 121 may be different from each other. Preferably, the upper surface of the first via part 121 may have a first width W1. In addition, the lower surface of the first via part 121 may have a second width W2 smaller than the first width W1. That is, the first via part 121 may have a cylindrical shape in which the width gradually decreases from the upper surface to the lower surface. Accordingly, the first width W1 and the second width W2 may mean a diameter of an upper surface and a diameter of a lower surface of the first via part 121, respectively.

The first-first pad 122 may be a capture pad of the first via portion 120. The width of the upper surface and the lower surface of the first-first pad 122 may be the same. Preferably, the first-first pad 122 may have a first width W1 corresponding to the upper surface of the first via part 121.

The first-second pad 123 may be a land pad of the first via portion 120. The width of the upper surface and the lower surface of the first-second pad 123 may be the same. Preferably, the first-second pad 123 may have a first width W1 corresponding to the upper surface of the first via part 121.

That is, the first-first pad 122 and the first-second pad 123 may have a first width W1 corresponding to the upper surface of the first via part 121.

As described above, in the embodiment, the width of the first-first pad 122 is the same as the width of the upper surface of the first via part 121. Accordingly, in the embodiment, the separation distance W3 between the plurality of first via portions 120 disposed in the first insulating layer 111 may increase compared to the comparative example illustrated in FIG. 1. That is, in the embodiment, the separation distance between the upper surfaces of the plurality of first via parts and the separation distance between the plurality of first-first pads may be the same. Accordingly, in the embodiment, the separation distance between the plurality of first via portions may be increased, thereby improving other circuit density and design freedom.

Meanwhile, a second via portion 130 is disposed in the second insulating layer 112. The second via portion 130 includes a second via part 131 that passes through the second insulating layer 112, and a second pad 32 disposed on the upper surface of the second insulating layer 112 and connected to the upper surface of the second via part 131.

In this case, a lower surface of the second via part 131 may be disposed in direct contact with the upper surface of the first-first pad 122 of the first via portion 120.

The upper and lower surfaces of the second via part 131 may have different widths. Preferably, the upper surface of the second via part 131 may have a first width W1, and the lower surface of the second via part 131 may have a second width W2 smaller than the first width W1.

The second pad 132 disposed on the upper surface of the second via part 131 may have a first width W1 corresponding to the upper surface of the second via part 131. A lower surface of the second pad 132 may directly contact an upper surface of the second via part 131. Specifically, the lower surface of the second pad 132 may contact only the upper surface of the second via part 131 while not in contact with the upper surface of the second insulating layer 112.

At this time, in the comparative example, the insulating layer 11 was formed of a thermosetting resin. Accordingly, a via hole for forming the via part may be formed by a laser process. In this case, as in the embodiment, when the width of the first-first pad 122 is the same as the width of the upper surface of the first via part 121, even if the formation position of the second via hole VH2 constituting the second via portion 130 is slightly shifted, the second via hole VH2 can pass through the first insulating layer 111, and accordingly, a defect may occur. That is, in the comparative example, the first-first pad served as a stopper for the laser process, and accordingly, there is a limit in reducing the width of the first-first pad.

In contrast, the second insulating layer 112 in the embodiment is formed of a photocurable resin as described above. Accordingly, the second via hole VH2 for forming the second via part 131 in the embodiment is formed through exposure and development processes, and accordingly, the via hole may be formed only in the desired insulating layer regardless of the width of the first-first pad 1122. Therefore, in the embodiment, it is possible to reduce the width of the first-first pad 122 as described above, and accordingly, it is possible to increase the separation distance between the plurality of first via portions 120.

Meanwhile, a third via portion 140 is disposed in the third insulating layer 113. The third via portion 140 includes a third via part 141 disposed through the third insulating layer 113 and a third pad 142 disposed on a lower surface of the third insulating layer 113 and connected to a lower surface of the third via part 141.

In this case, the upper surface of the third via part 141 may be disposed in direct contact with the lower surface of the first-second pad 123 of the first via portion 120.

The upper and lower surfaces of the third via part 141 may have different widths.

Preferably, the upper surface of the third via part 141 may have a second width W2, and a lower surface of the third via part 141 may have a first width W1 greater than the second width W2.

The third pad 142 disposed on the lower surface of the third via part 141 may have the first width W1 corresponding to the lower surface of the third via part 141. An upper surface of the third pad 142 may directly contact a lower surface of the third via part 141. Specifically, the upper surface of the third pad 142 may contact only the lower surface of the third via part 141 while not in contact with the lower surface of the third insulating layer 113.

Meanwhile, a fourth via portion 150 is disposed in the fourth insulating layer 114. The fourth via portion 150 includes a fourth via part 151 passing through the fourth insulating layer 114 and a fourth pad 152 disposed on the upper surface of the fourth insulating layer 114 and connected to the upper surface of the fourth via part 151.

In this case, a lower surface of the fourth via part 151 may be disposed in direct contact with the upper surface of the second pad 132 of the second via portion 130.

The upper and lower surfaces of the fourth via part 151 may have different widths. Preferably, the upper surface of the fourth via part 151 may have a first width W1, and a lower surface of the fourth via part 151 may have a second width W2 smaller than the first width W1.

The fourth pad 152 disposed on the upper surface of the fourth via part 151 may have the first width W1 corresponding to the upper surface of the fourth via part 151. A lower surface of the fourth pad 152 may directly contact the upper surface of the fourth via part 151. Specifically, the lower surface of the fourth pad 152 may contact only the upper surface of the fourth via part 151 while not in contact with the upper surface of the fourth insulating layer 114.

Also, similarly to the second via portion 130, the fourth via hole VH4 constituting the fourth via part 151 can be stably formed regardless of the width of the second pad 132 of the second via portion 130, and accordingly, the width of the second pad 132 may be the same as that of the upper surface of the second via part 131.

Meanwhile, a fifth via portion 160 is disposed in the fifth insulating layer 115. The fifth via portion 160 includes a fifth via part 161 passing through the fifth insulating layer 115, and a fifth pad 162 disposed on a lower surface of the fifth insulating layer 115 and connected to a lower surface of the fifth via part 161.

In this case, an upper surface of the fifth via part 161 may be disposed in direct contact with the lower surface of the third pad 142 of the third via portion 140.

The upper and lower surfaces of the fifth via part 161 may have different widths. Preferably, the upper surface of the fifth via part 161 may have a second width W2, and a lower surface of the fifth via part 161 may have a first width W1 greater than the second width W2.

The fifth pad 162 disposed on the lower surface of the fifth via part 161 may have the first width W1 corresponding to the lower surface of the fifth via part 161. An upper surface of the fifth pad 162 may directly contact the lower surface of the fifth via part 161. Specifically, the upper surface of the fifth pad 162 may contact only the lower surface of the fifth via part 161 while not in contact with the lower surface of the fifth insulating layer 115.

Also, similarly to the second via portion 130 and the fourth via portion 150, the fifth via hole VH5 constituting the fifth via part 161 can be stably formed regardless of the width of the third pad 142 of the third via portion 130, and accordingly, the width of the third pad 142 may be the same as that of the upper surface of the third via part 141.

Meanwhile, in the first embodiment, the first to fifth via portions 120, 130, 140, 150, and 160 may be arranged on the same vertical line CL.

Preferably, centers of the first via part 121 and the first pads 122 and 123 constituting the first via portion 120 may be aligned on one vertical line CL.

In addition, center of each of the second via part 131 and the second pad 132 constituting the second via portion 130 may be aligned with the center of the first via part 121 and the first pads 122 and 123 constituting the first via portion 120 on one vertical line CL.

In addition, center of each of the third via part 141 and the third pad 142 constituting the third via portion 140 may be aligned with the center of the center of the first via part 121, the first pads 122 and 123, the second via part 131 and the second pad 132 on one vertical line CL.

In addition, center of each of the fourth via part 151 and the fourth pad 152 constituting the fourth via portion may be aligned with the center of the center of the first via part 121, the first pads 122 and 123, the second via part 131, the second pad 132, the third via part 141 and the third pad 142 on one vertical line CL.

In addition, each center of the fifth via part 161 and the fifth pad 162 constituting the fifth via portion 160 may be aligned with the center of the center of the first via part 121, the first pads 122 and 123, the second via part 131, the second pad 132, the third via part 141, the third pad 142, the fourth via part 151 and the fourth pad 152 on one vertical line CL.

According to an embodiment, each via portion interconnected in the printed circuit board having a multilayer structure includes a via part passing through an insulating layer and a pad disposed on one surface of the via part. In this case, in the printed circuit board according to the embodiment, the width of the pad is not greater than the width of the one surface of the via part. In other words, the width of the pad of each via portion included in the printed circuit board may be equal to or smaller than the width of one surface of the via part.

According to this, the printed circuit board of the embodiment can increase a separation distance between the plurality of via portions, and accordingly, it is easy to implement a fine pattern of the circuit pattern, so that the circuit density can be increased.

In addition, the embodiment can improve the design freedom of the overall printed circuit board according to the design change of the via portion, and accordingly, it is possible to secure a fine pattern implementation and substrate reliability.

In an embodiment, the centers of the via portions directly connected to each other in the vertical direction may be arranged to be aligned on the same vertical line, or alternatively, may be arranged in a zigzag manner so as to be shifted from each other. Here, the aligned or zigzag portion may be the via part of each via portion, or alternatively, may be the pad of each via portion, or alternatively, may be both the via part and the pad of each via portion. According to this, the shape or position of the via portion can be freely changed according to the design of the circuit pattern required in the printed circuit board including the via portion, and accordingly, the degree of design freedom can be improved.

FIGS. 4 to 10 are views showing a manufacturing method of the printed circuit board according to the first embodiment shown in FIG. 2 in order of process.

Figure 4:
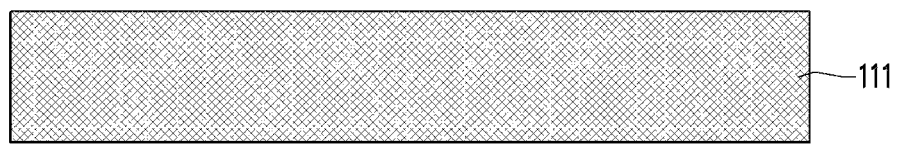
FIGS. 4 to 10 are views showing a manufacturing method of the printed circuit board according to the first embodiment shown in FIG. 2 in order of process.
Figure 4:
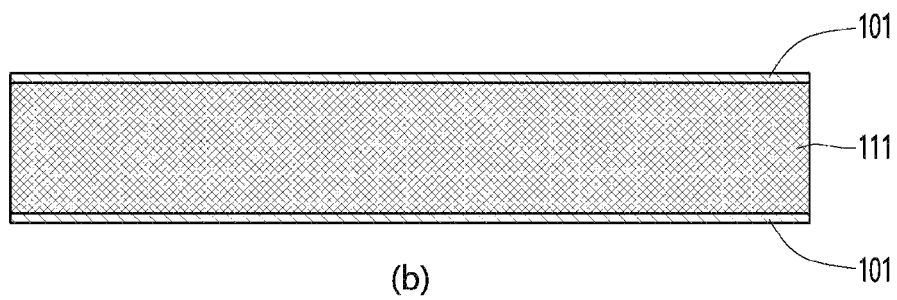

First, referring to FIG. 4 (*a*), the first insulating layer 111 serving as the basis of the printed circuit board is prepared.

Figure 5:
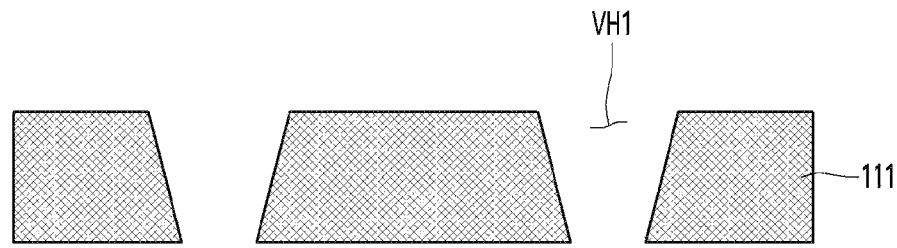

Next, referring to FIG. 5, at least one first via hole VH1 may be formed in the first insulating layer 111. The first via hole VH1 may be formed to pass through the upper and lower surfaces of the first insulating layer 111.

Figure 6:
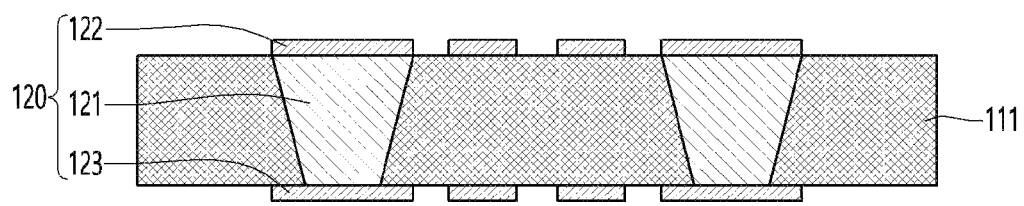

Next, referring to FIG. 6, the first via hole VH1 formed in the first insulating layer 111 is filled with a metal material to form the first via portion 120. In this case, the first via portion includes a first via part 121 passing through the first insulating layer 111, and the first pads 122 and 123 on the upper and lower surfaces of the first insulating layer 111 and connected to the first via part 121.

The first via part 121 may be formed by filling the first via hole VH1 passing through the first insulating layer 111 with a conductive material.

In addition, the first via portion 120 may include first pads 122 and 123 disposed on the upper and lower surfaces of the first insulating layer 111. At this time, since the characteristics of the first pads 122 and 123 have already been described above, a detailed description thereof will be omitted.

Figure 7:
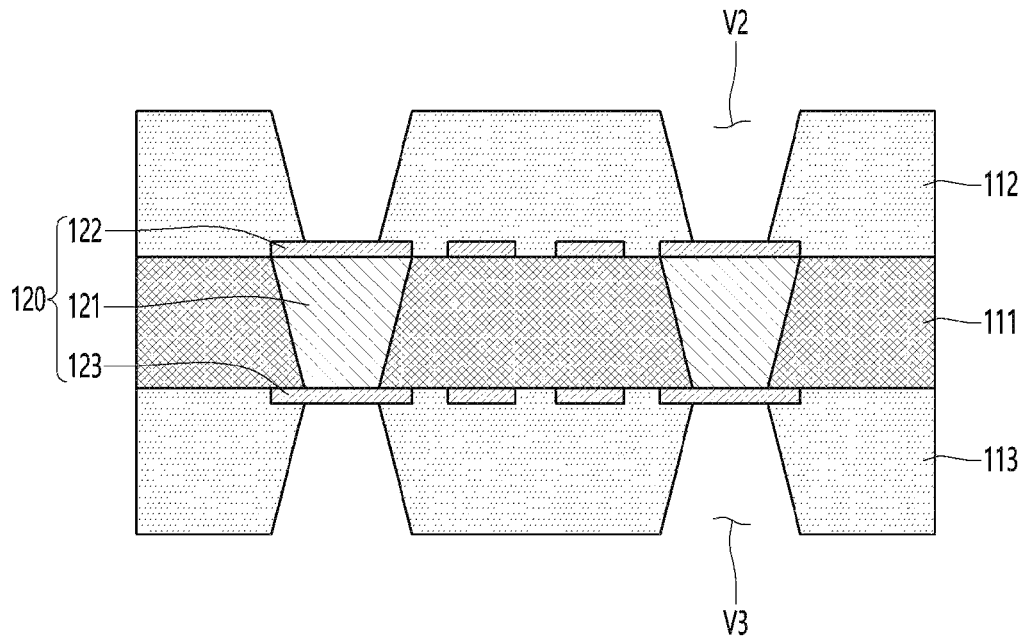

Next, as shown in FIG. 7, a second insulating layer 112 is disposed on the upper surface of the first insulating layer 111, and a third insulating layer 113 is disposed below the lower surface of the first insulating layer 111. In this case, the second insulating layer 112 and the third insulating layer 113 may include a photocurable resin or a photosensitive resin.

In addition, a second via hole VH2 passing through the upper and lower surfaces of the second insulating layer 112 may be formed in the second insulating layer 112. In this case, the second via hole VH2 may be formed to expose the first-first pad 122 constituting the first via portion 120.

Also, a third via hole VH3 passing through the upper and lower surfaces of the third insulating layer 113 may be formed in the third insulating layer 113. In this case, the third via hole VH3 may be formed to expose the first-second pad 123 constituting the first via portion 120.

In this case, the second insulating layer 112 and the third insulating layer 113 are formed of a photocurable resin, and accordingly, as the second via hole VH2 and the third via hole VH3 are formed through exposure and development processes, the depth thereof can be easily adjusted. Accordingly, the widths of the first-first pad 122 and the first-second pad 123 that previously served as stoppers can be freely formed.

Figure 8:
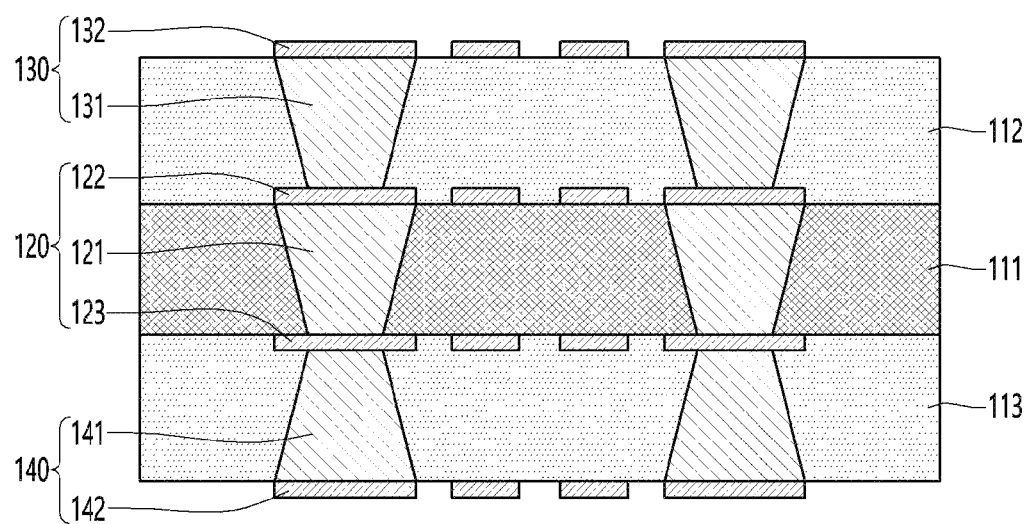

Next, as shown in FIG. 8, a second via portion 130 is formed in the second via hole VH2 of the second insulating layer 112, and the third via portion 130 is formed in the via hole VH3 of the third insulating layer 113.

In this case, the second via portion 130 includes a second via part 131 passing through the second insulating layer 112, and a second pad 132 disposed on the upper surface of the second insulating layer 112 and connected to the upper surface of the second via part 131.

In addition, the third via portion 140 includes a third via part 141 passing through the third insulating layer 113 and a third pad 142 disposed on the lower surface of the third insulating layer 113 and connected to the lower surface of the third via part 141.

Since the characteristics of the second via portion 130 and the third via portion 140 have already been described above, a detailed description thereof will be omitted.

Figure 9:
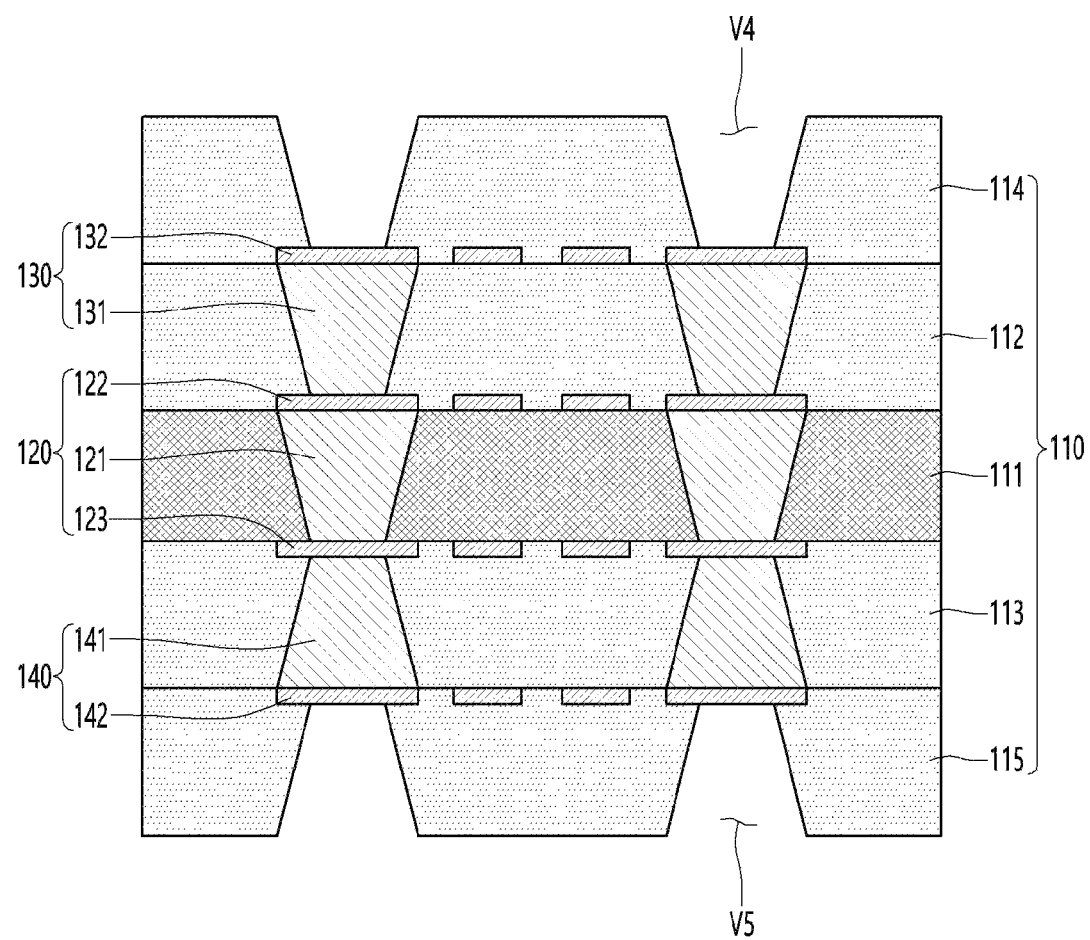

Next, as shown in FIG. 9, a fourth insulating layer 114 is disposed on the upper surface of the second insulating layer 112, and a fifth insulating layer 115 is disposed below the lower surface of the third insulating layer 113. In this case, the fourth insulating layer 114 and the fifth insulating layer 115 may include a photocurable resin or a photosensitive resin.

In addition, a fourth via hole VH4 passing through the upper and lower surfaces of the fourth insulating layer 114 may be formed in the fourth insulating layer 114. In this case, the fourth via hole VH4 may be formed to expose the second pad 132 constituting the second via portion 130.

In addition, a fifth via hole VH5 passing through the upper and lower surfaces of the fifth insulating layer 115 may be formed in the fifth insulating layer 115. In this case, the fifth via hole VH5 may be formed to expose the third pad 142 constituting the third via portion 140.

At this time, the fourth insulating layer 114 and the fifth insulating layer 115 are formed of a photocurable resin, and accordingly, the depth of the fourth via hole VH4 and the fifth via hole VH5 can be easily adjusted as they are formed through exposure and development processes, etc. Accordingly, the widths of the second pad 132 and the third pad 142, which previously served as stoppers, can be freely formed.

Figure 10:
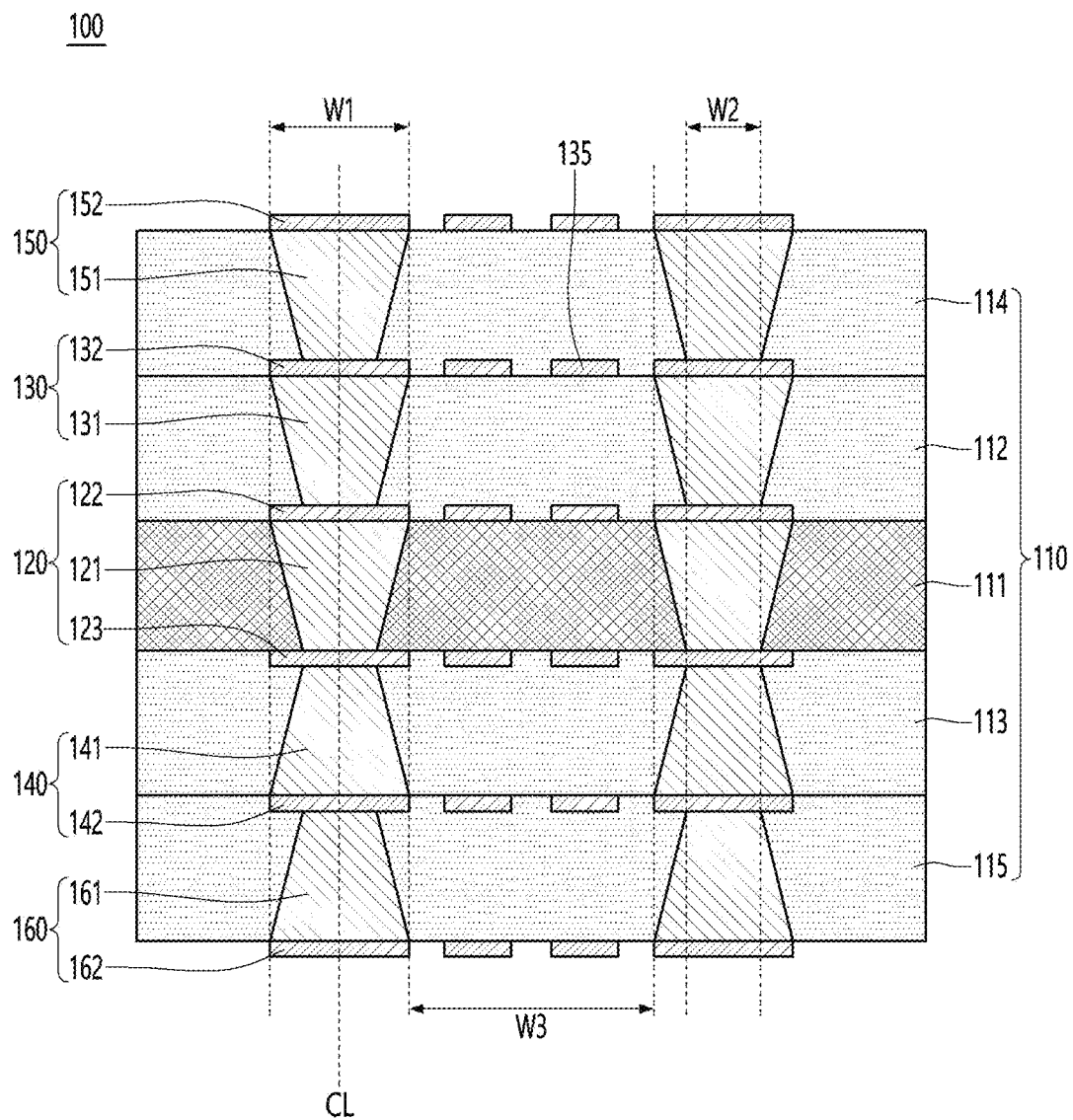

Next, as shown in FIG. 10, a fourth via portion 150 is formed in the fourth via hole VH4 of the fourth insulating layer 114, and a fifth via portion 160 is formed in the via hole VH5 of the fifth insulating layer 115.

The fourth via portion 150 includes a fourth via part 151 passing through the fourth insulating layer 114, and a fourth pad 152 disposed on the upper surface of the fourth insulating layer 114 and connected to the upper surface of the fourth via part 151.

The fifth via portion 160 includes a fifth via part 161 passing through the fifth insulating layer 115, and a fifth pad 162 disposed on a lower surface of the fifth insulating layer 115 and connected to the lower surface of the fifth via part 161.

Hereinafter, various modified embodiments will be described with reference to the structure of the printed circuit board according to the first embodiment described with reference to FIG. 2.

In the following description of the printed circuit board, the same reference numerals will be assigned to parts substantially identical to those of the previous embodiment.

Figure 11:
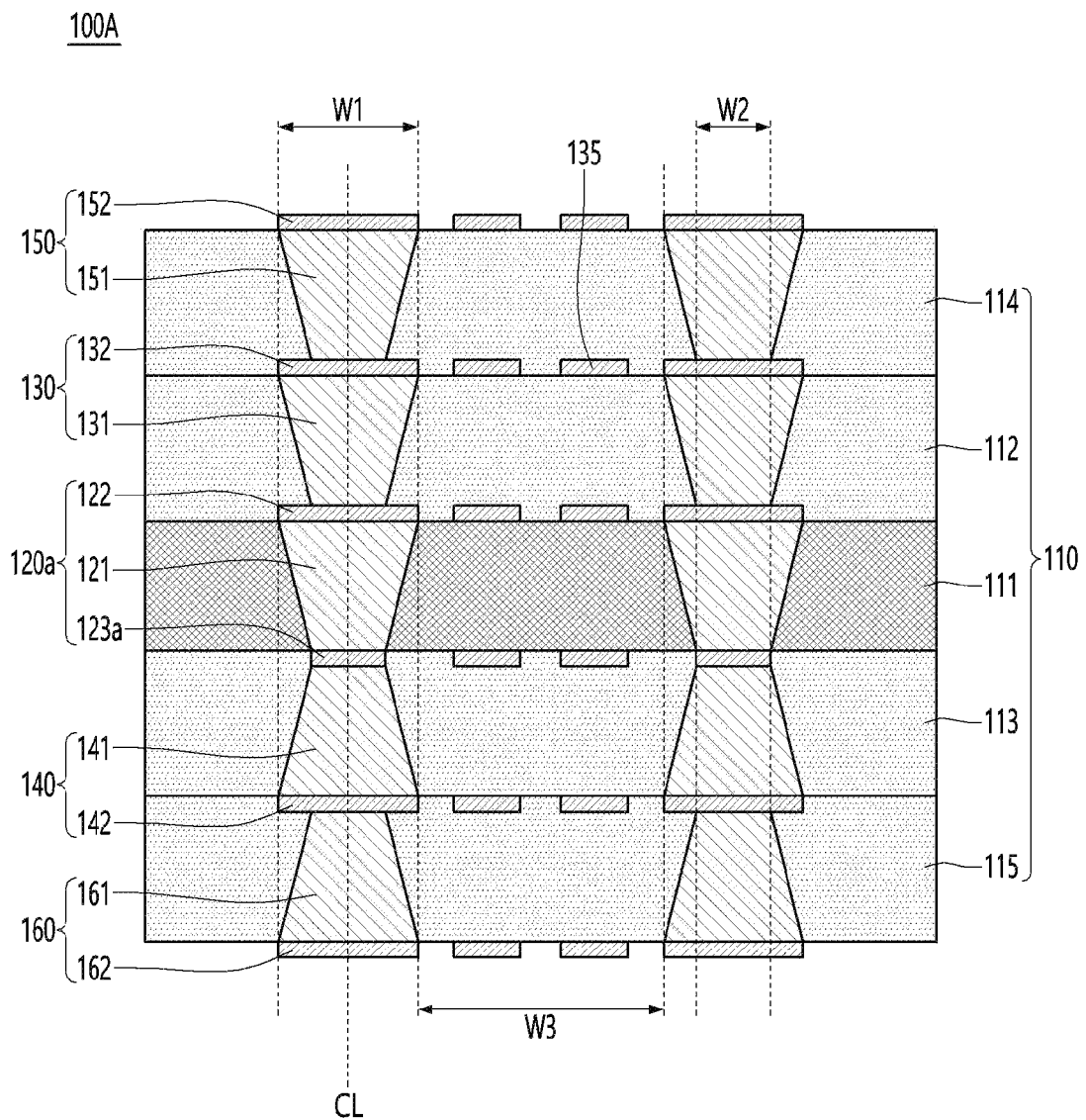
FIG. 11 is a view showing a printed circuit board according to a second embodiment.

FIG. 11 is a view showing a printed circuit board according to a second embodiment.

Referring to FIG. 11, the printed circuit board 100A includes an insulating layer 110, via portions 120a, 130, 140, 150, 160, and a circuit pattern 135.

The insulating layer 110 includes a first insulating layer 111, a second insulating layer 112, a third insulating layer 113, a fourth insulating layer 114, and a fifth insulating layer 115.

Via portions 120a, 130, 140, 150, 160 include a first via portion 120a disposed in the first insulating layer 111, a second via portion 130 disposed in the second insulating layer 112, a third via portion 140 disposed in the third insulating layer 113, a fourth via portion 150 disposed in the fourth insulating layer 114, and a fifth via portion 160 disposed in the fifth insulating layer 115.

Here, in the printed circuit board 100A of the second embodiment, the configuration other than the first via portion 120a is the same as the printed circuit board 100 according to the first embodiment in FIG. 2, and accordingly, hereinafter only the first via portion 120a will be described.

The first via portion 120a includes the first via part 121 disposed in the first insulating layer 111 and first pads 122 and 123a disposed on the upper and lower surfaces of the first insulating layer 111.

The first pads 122 and 123a includes a first-first pad 122 disposed on the upper surface of the first insulating layer 111 and contacting with the upper surface of the first via part 121. The width of the first-first pad 122 may be the same as the width of the upper surface of the first via part 121.

In addition, the first pads 122 and 123a include first-second pad 123a disposed on the lower surface of the first insulating layer 111 and contacting the lower surface of the first via part 121. The width of the first-second pad 123a may be the same as the width of the lower surface of the first via part 121.

That is, the width of the first-second pad 123 in FIG. 2 was the same as the width of the upper surface of the first via part 121 and the width of the first-first pad 122.

Alternatively, the width of the first-second pad 123 according to the second embodiment in FIG. 11 may be the same as a width W2 of a lower surface of the first via part 121 and a width W2 of an upper surface of the third via part 141 of the third via portion 140. That is, as the third via hole VH3 is formed through the exposure and development process, the width of the first-second pad 123a, which served as a stopper for its formation in the comparative example, can be freely adjusted. For example, it may have the same width as the lower surface of the first via part 121.

Figure 12:
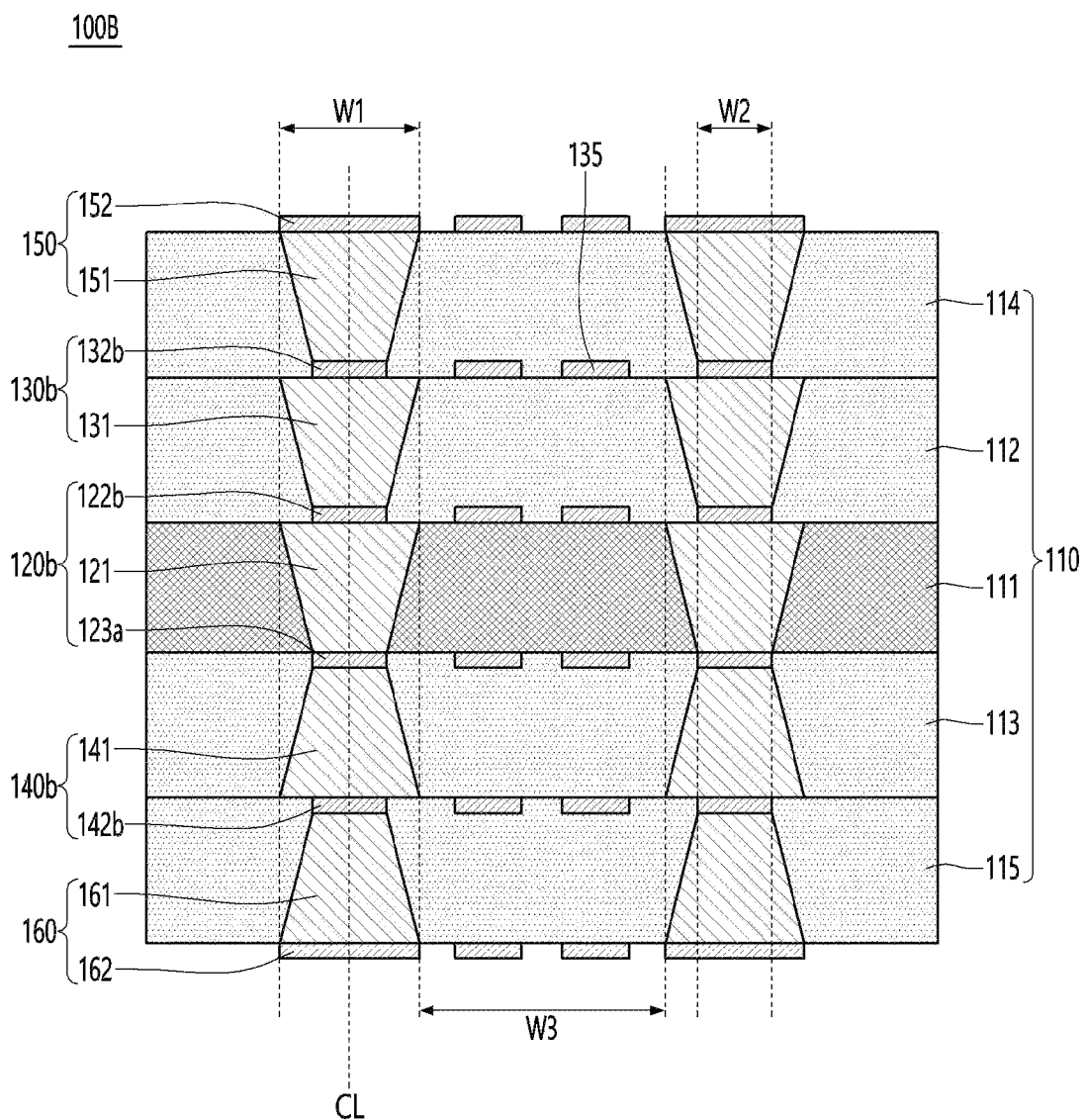
FIG. 12 is a view showing a printed circuit board according to a third embodiment.

FIG. 12 is a view showing a printed circuit board according to a third embodiment.

Referring to FIG. 12, the printed circuit board 100B includes an insulating layer 110, via portions 120b, 130b, 140b, 150, 160, and a circuit pattern 135.

The insulating layer 110 includes a first insulating layer 111, a second insulating layer 112, a third insulating layer 113, a fourth insulating layer 114, and a fifth insulating layer 115.

The via portions 120b, 130b, 140b, 150 and 160 include a first via portion 120b disposed in the first insulating layer 111, a second via portion 130b disposed in the second insulating layer 112, a third via portion 140b disposed in the third insulating layer 113, a fourth via portion 150 disposed in the fourth insulating layer 114, and a fifth via portion 160 disposed in the fifth insulating layer 115.

Here, in the printed circuit board 100B of the second embodiment, the configuration other than the first via portion 120b, the second via portion 130b, and the third via portion 140b is the same as the printed circuit board 100 according to the first embodiment in FIG. 2, and accordingly, hereinafter, only the second via portion 130b, and the third via portion 140b will be described.

The first via portion 120b includes the first via part 121 disposed in the first insulating layer 111 and first pads 122b and 123b disposed on the upper and lower surfaces of the first insulating layer 111.

The first pads 122b and 123b includes a first-first pad 122b disposed on the upper surface of the first insulating layer 111 and contacting with the upper surface of the first via part 121. A width of the first-first pad 122b may be smaller than a width of the upper surface of the first via part 121.

Preferably, the width of the first-first pad 122b may be the same as the width of the lower surface of the second via part 131 of the second via portion 130b. In other words, the width of the first-first pad 122b may have the same second width W2 as the width of the lower surface of the first via part 121 and the width of the first-second pad 123b.

Accordingly, the upper surface of the first via part 121 in the first or second embodiment only made contact with the lower surface of the first-first pad 122. However, in the third embodiment, the upper surface of the first via part 121 may include a first region in contact with the lower surface of the second insulating layer 112 and a second region in contact with the first-first pad 122b.

In addition, the first pads 122b and 123b include first-second pads 123b disposed on the lower surface of the first insulating layer 111 and contacting the lower surface of the first via part 121. A width of the first-second pad 123b may be the same as a width of a lower surface of the first via part 121.

In addition, the second via portion 130b may include a second via part 131 and a second pad 132b disposed on an upper surface of the second via part 131. In this case, the second pad 132b does not have the same width as the upper surface of the second via part 131, and may have the same width as the lower surface of the fourth via part 151 of the fourth via portion 150 or the lower surface of the second via part 131.

Also, the third via portion 140b may include a third via part 141 and a third pad 142b disposed under a lower surface of the third via part 141. In this case, the third pad 142b does not have the same width as the lower surface of the third via part 141, and may have the same width as the upper surface of the fifth via part 161 of the fifth via portion 160 or the upper surface of the third via part 141.

As described above, widths of the first pads 122b and 123b, the second pad 132b, and the third pad 142b according to the third embodiment may be adjusted to the second width W2 instead of the first width W1.

Figure 13:
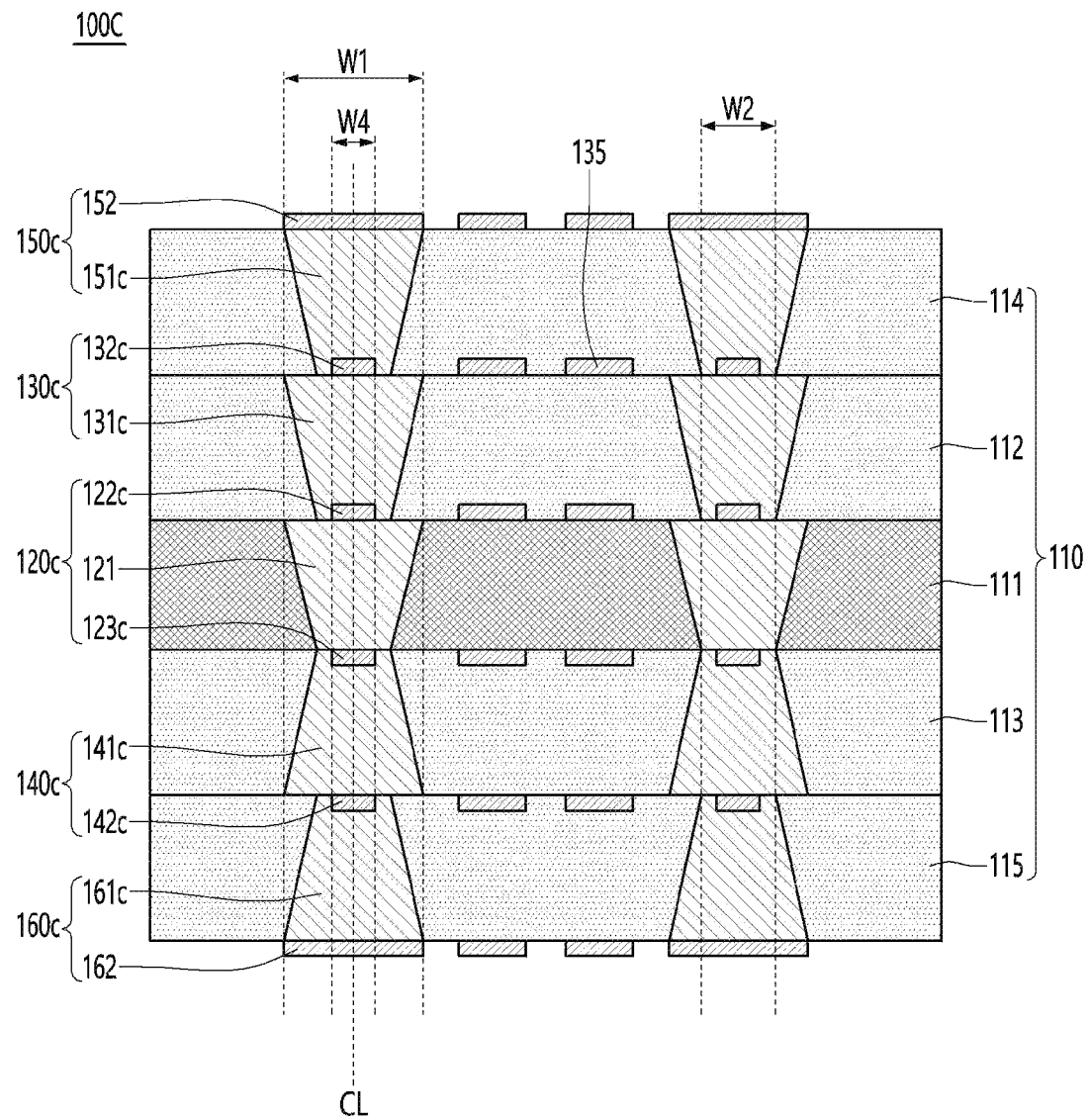
FIG. 13 is a view showing a printed circuit board according to a fourth embodiment.

FIG. 13 is a view showing a printed circuit board according to a fourth embodiment.

Referring to FIG. 13, the printed circuit board 100C includes an insulating layer 110, via portions 120c, 130c, 140c, 150c, 160c, and a circuit pattern 135.

The insulating layer 110 includes a first insulating layer 111, a second insulating layer 112, a third insulating layer 113, a fourth insulating layer 114, and a fifth insulating layer 115.

The via portions 120c, 130c, 140c, 150c, and 160c include a first via portion 120c disposed in the first insulating layer 111, a second via portion 130c disposed in the second insulating layer 112, a third via portion 140c disposed in the third insulating layer 113, a fourth via portion 150c disposed in the fourth insulating layer 114, and a fifth via portion 160c disposed in the fifth insulating layer 115.

Here, in the printed circuit board 100C of the fourth embodiment, other configurations except for the via portions 120c, 130c, 140c, 150c, and 160c are the same as the printed circuit board 100 according to the first embodiment in FIG. 2. Accordingly, hereinafter, only the via portions 120c, 130c, 140c, 150c, and 160c will be described.

The first via portion 120c includes a first via part 121 disposed in the first insulating layer 111 and first pads 122c and 123c disposed on the upper and lower surfaces of the first insulating layer 111.

The first pads 122c and 123c includes a first-first pad 122c disposed on the upper surface of the first insulating layer 111 and contacting with the upper surface of the first via part 121. A width of the first-first pad 122c may be smaller than a width of an upper surface of the first via part 121.

Preferably, the width of the first-first pad 122c may be smaller than the width of the lower surface of the second via part 131c of the second via portion 130c. That is, the width of the first-first pad 122c may have a fourth width W4 smaller than the first width W1 and the second width W2.

Accordingly, the upper surface of the first via part 121 in the first or second embodiment only made contact with the lower surface of the first-first pad 122. However, the upper surface of the first via part 121 in the fourth embodiment includes a first region in contact with a lower surface of the second insulating layer 112, a second region in contact with the lower surface of the first-first pad 122c, and a third region in contact with the lower surface of the second via part 131c.

In addition, the first pads 122c and 123c include first-second pads 123c disposed on the lower surface of the first insulating layer 111 and contacting the lower surface of the first via part 121. A width of the first-second pad 123c may be smaller than a width of a lower surface of the first via part 121. That is, the first-second pad 123c may have a fourth width W4.

Also, the second via portion 130c may include a second via part 131c and a second pad 132c disposed on the upper surface of the second via part 131c. In this case, the second pad 132c may have a fourth width W4 smaller than the upper and lower surfaces of the second via part 131c and the lower surface of the fourth via part 151c. Accordingly, the upper surface of the second via part 131c includes a first region in contact with the lower surface of the fourth insulating layer 114, a second region in contact with the lower surface of the second pad 132c, and a third region in contact with the lower surface of the fourth via part 151c.

Also, the third via portion 140c may include a third via part 141c and a third pad 142c disposed under a lower surface of the third via part 141c. In this case, the third pad 142c may have a fourth width W4 smaller than the same width as the lower and upper surfaces of the third via part 141c. Accordingly, the lower surface of the third via part 141c includes a first region in contact with the fifth insulating layer 115, a second region in contact with the third pad 142c, and a third region in contact with the fifth via part 161c.

Also, the fourth via portion 150c may include a fourth via part 151c and a second pad 152 disposed on an upper surface of the fourth via part 151c.

The fifth via portion 160c may include a fifth via part 161c and a fifth pad 162 disposed under a lower surface of the fifth via part 161c.

As described above, widths of the first pads 122c and 123c, the second pad 132c, and the third pad 142c may be adjusted to a fourth width W4 smaller than the first width W1 and the second width W2, and accordingly, it may have a structure surrounded by the via part disposed on the upper side or the lower side thereof.

Figure 14:
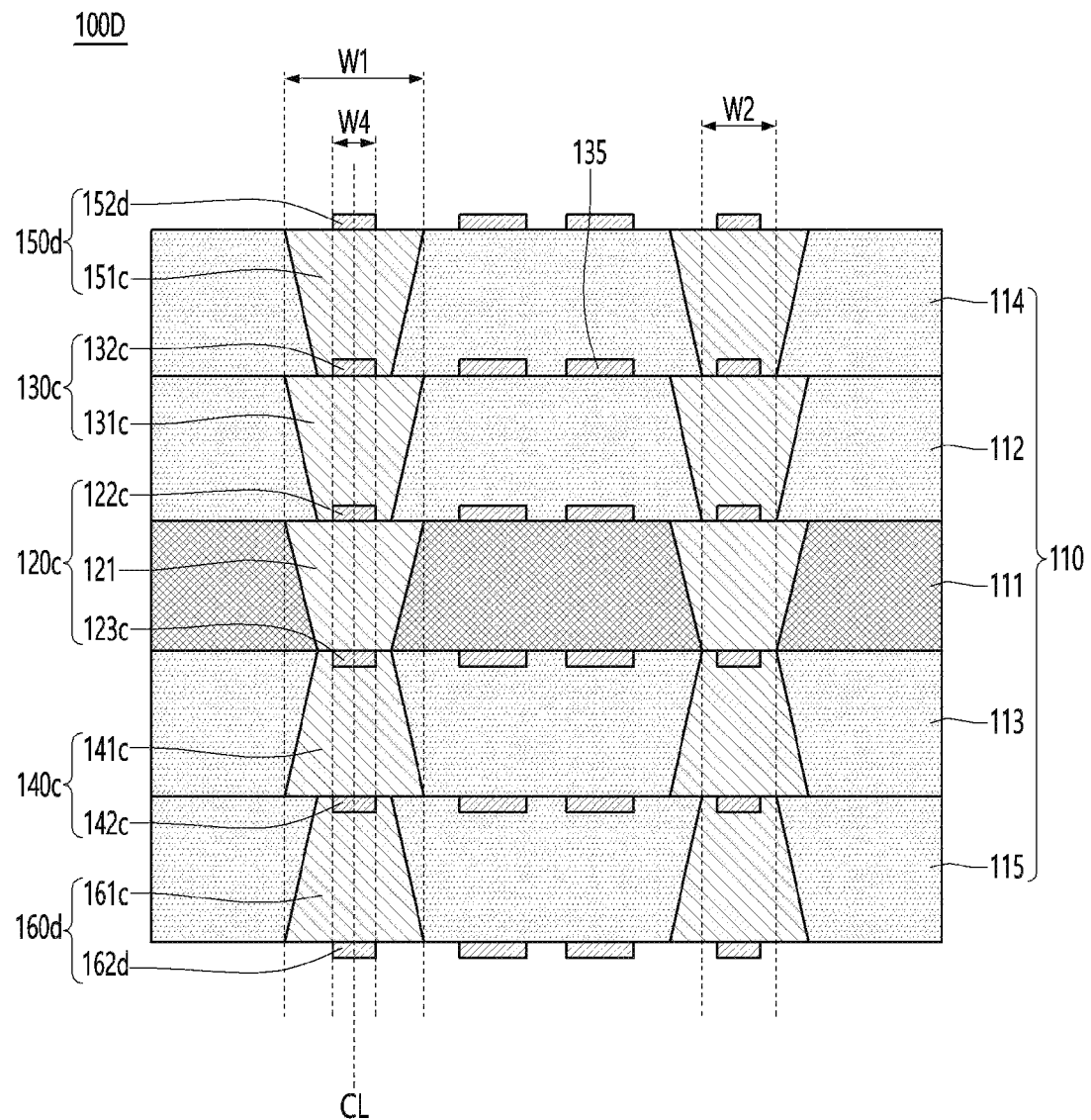
FIG. 14 is a view showing a printed circuit board according to a fifth embodiment.

FIG. 14 is a view showing a printed circuit board according to a fifth embodiment.

Referring to FIG. 14, the printed circuit board 100D includes an insulating layer 110, via portions 120c, 130c, 140c, 150d and 160d, and a circuit pattern 135.

The insulating layer 110 includes a first insulating layer 111, a second insulating layer 112, a third insulating layer 113, a fourth insulating layer 114, and a fifth insulating layer 115.

The via portions 120c, 130c, 140c, 150d, and 160d include a first via portion 120c disposed in the first insulating layer 111, a second via portion 130c disposed in the second insulating layer 112, a third via portion 140c disposed in the third insulating layer 113, a fourth via portion 150d disposed in the fourth insulating layer 114, and a fifth via portion 160d disposed in the fifth insulating layer 115.

Here, in the printed circuit board 100D of the fifth embodiment, other configurations except for the via portions 120c, 130c, 140c, 150c, and 160c are the same as the printed circuit board 100 according to the fourth embodiment in FIG. 13. Accordingly, hereinafter only the fourth and fifth via portions 150d and 160d will be described.

The fourth via portion 150d may include a fourth via part 151c and a fourth pad 152d disposed on the upper surface of the fourth via part 151c.

The fifth via portion 160d may include a fifth via part 161c and a fifth pad 162d disposed under a lower surface of the fifth via part 161c.

In this case, the fourth pad 152 and the fifth pad 162 in the fourth embodiment have a first width W1. Alternatively, the fourth pad 152d and the fifth pad 162d according to the fifth embodiment may have a fourth width W4 smaller than the first width W1 and the second width W2.

Figure 15:
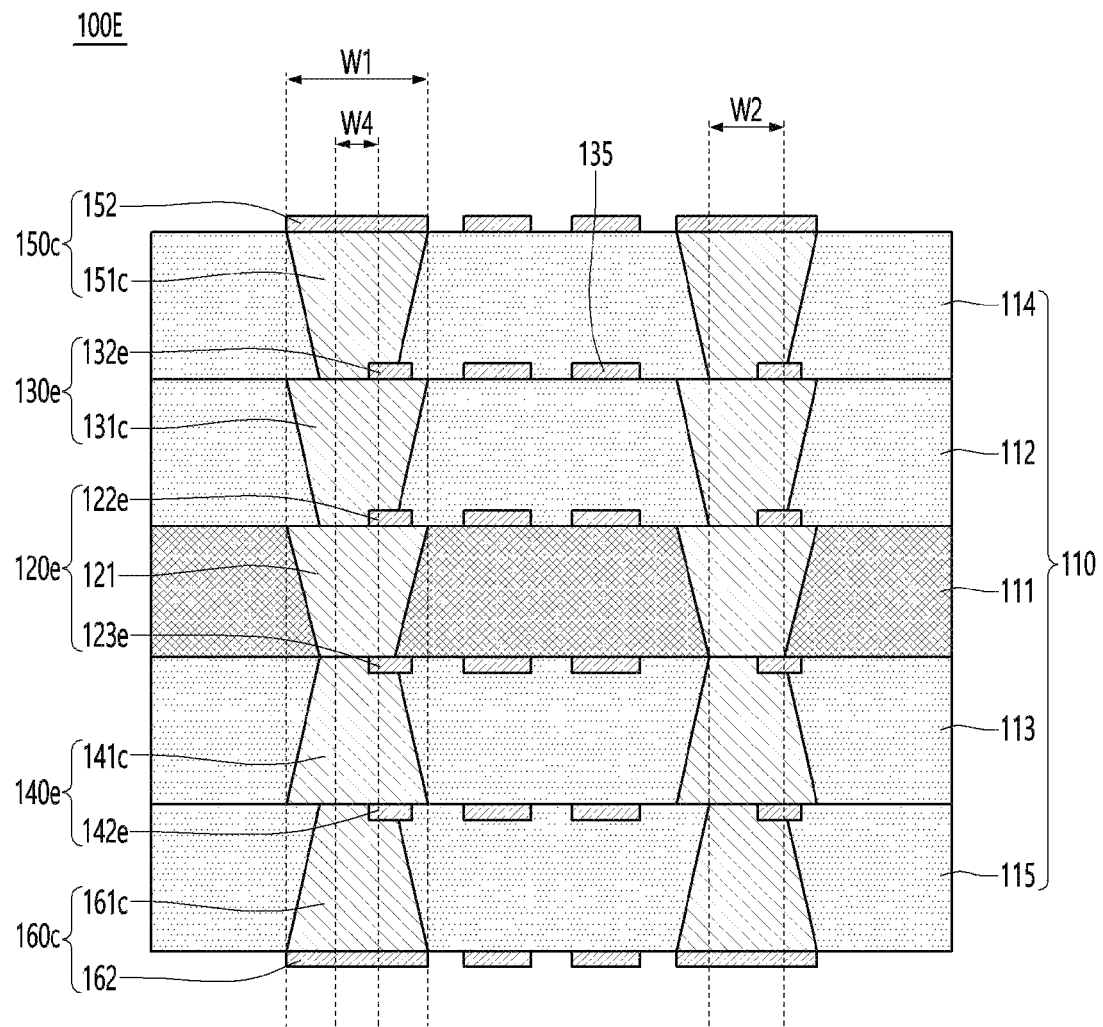
FIG. 15 is a view showing a printed circuit board according to a sixth embodiment.

FIG. 15 is a view showing a printed circuit board according to a sixth embodiment.

Referring to FIG. 15, the printed circuit board 100E includes an insulating layer 110, via portions 120e, 130e, 140e, 150c, 160c, and a circuit pattern 135.

The insulating layer 110 includes a first insulating layer 111, a second insulating layer 112, a third insulating layer 113, a fourth insulating layer 114, and a fifth insulating layer 115.

The via portions 120e, 130e, 140e, 150 and 160c include a first via portion 120e disposed in the first insulating layer 111, a second via portion 130e disposed in the second insulating layer 112, a third via portion 140e disposed in the third insulating layer 113, a fourth via portion 150c disposed in the fourth insulating layer 114, and a fifth via portion 160c disposed in the fifth insulating layer 115.

Here, in the printed circuit board 100E of the sixth embodiment, other configurations except for the via portions 120e, 130e, and 140e are the same as those of the printed circuit board 100 according to the fourth embodiment in FIG. 13, and accordingly, hereinafter, only the via portions 120e, 130e, and 140e will be described.

The first via portion 120e includes the first via part 121 disposed in the first insulating layer 111 and first pads 122e and 123e disposed on the upper and lower surfaces of the first insulating layer 111.

In this case, centers of the first via part and the first pads in the previous embodiment are aligned on the same vertical line.

Alternatively, a virtual vertical line passing through the center of the first via part 121 may be parallel to a virtual vertical line passing through the center of the first pads 122e and 123e. For example, the virtual vertical line passing through the center of the first via part 121 may be spaced apart from a virtual vertical line passing through the center of the first pads 122e and 123e in a horizontal direction. For example, the virtual vertical line passing through the center of the first via part 121 and the virtual vertical line passing through the center of the first pads 122e and 123e may be deviated from each other.

Also, the second via portion 130e may include a second via part 131c and a second pad 132e disposed on the upper surface of the second via part 131c. In this case, centers of the second pad 132e and the second via part 131c may be deviated from each other similarly to the first via portion 120e.

Also, the third via portion 140e may include a third via part 141c and a third pad 142e disposed under a lower surface of the third via part 141c. In this case, the centers of the third pad 142e and the third via part 141c may be deviated from each other similarly to the first via portion 120e and the second via portion 130e.

In this case, the centers of the via parts 121, 131c and 141c each of the first to third via portions 120e, 130e, and 140e may be aligned on the same one vertical line. Also, the centers of the pads 122e, 123e, 132e, and 142e of each of the first to third via portions 120e, 130e, and 140e may be aligned on the same one vertical line. However, the center of each of the via parts 121, 131c and 141c and the center of each of the pads 122e, 123e, 132e and 142e may be deviated from each other.

Meanwhile, the lower surface of the second via part 131c overlaps the upper surface of the first-first pad 122e by at least 20% in a vertical direction. In this case, when the overlap area between the lower surface of the second via part 131c and the upper surface of the first-first pad 122e is less than 20%, connection reliability between the first via portion and the second via portion may decrease.

Figure 16:
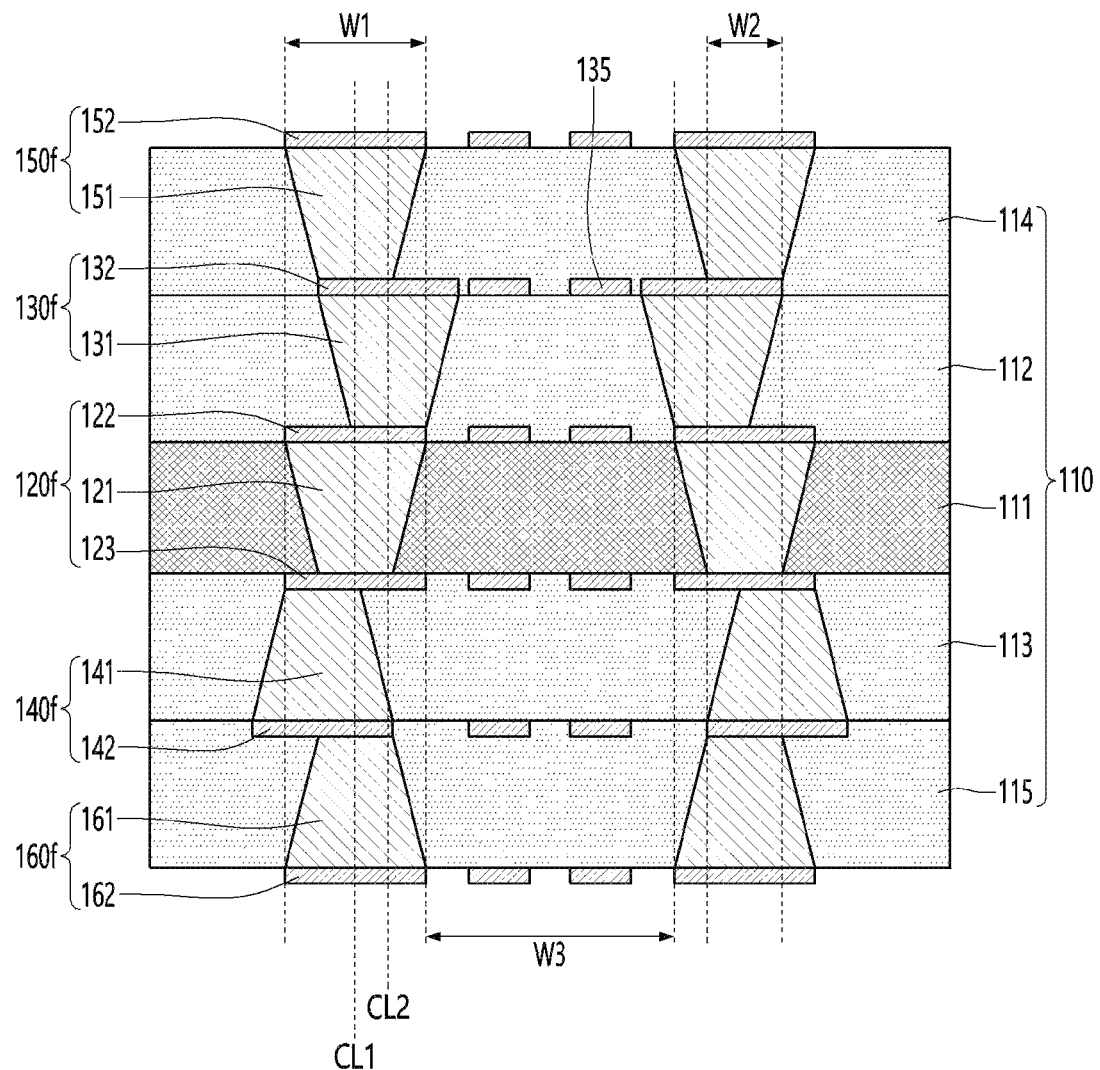
FIG. 16 is a view showing a printed circuit board according to a seventh embodiment.

FIG. 16 is a view showing a printed circuit board according to a seventh embodiment.

Referring to FIG. 16, the printed circuit board 100F includes an insulating layer 110, via portions 120f, 130f, 140f, 150f, and 160f, and a circuit pattern 135.

As described above, the via portions 120f, 130f, 140f, 150f, and 160f each include a via part and a pad.

In this case, centers of the via part and the pad constituting each via portion may be aligned on the same vertical line.

However, the centers of the adjacent vias may be deviated.

For example, the centers of the first via parts 121 and the first pads 122 and 123 constituting the first via portion 120f may be aligned on the same first vertical line CL1.

Also, the centers of the second via part 131 and the second pad 132 constituting the second via portion 130f may be aligned on the same second vertical line CL2.

However, the first vertical line CL1 and the second vertical line CL2 may be spaced apart from each other by a predetermined interval in the horizontal direction.

According to an embodiment, each via portion interconnected in the printed circuit board having a multilayer structure includes a via part passing through an insulating layer and a pad disposed on one surface of the via part. In this case, in the printed circuit board according to the embodiment, the width of the pad is not greater than the width of the one surface of the via part. In other words, the width of the pad of each via portion included in the printed circuit board may be equal to or smaller than the width of one surface of the via part.

According to this, the printed circuit board of the embodiment can increase a separation distance between the plurality of via portions, and accordingly, it is easy to implement a fine pattern of the circuit pattern, so that the circuit density can be increased.

In addition, the embodiment can improve the design freedom of the overall printed circuit board according to the design change of the via portion, and accordingly, it is possible to secure a fine pattern implementation and substrate reliability.

In an embodiment, the centers of the via portions directly connected to each other in the vertical direction may be arranged to be aligned on the same vertical line, or alternatively, may be arranged in a zigzag manner so as to be shifted from each other. Here, the aligned or zigzag portion may be the via part of each via portion, or alternatively, may be the pad of each via portion, or alternatively, may be both the via part and the pad of each via portion. According to this, the shape or position of the via portion can be freely changed according to the design of the circuit pattern required in the printed circuit board including the via portion, and accordingly, the degree of design freedom can be improved.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

What is claimed is:

1. A printed circuit board comprising:
a first insulating layer;
a second insulating layer disposed on an upper surface of the first insulating layer;
a first via portion disposed in the first insulating layer;
a circuit pattern disposed on the upper surface of the first insulating layer and connected to the first via portion, and
a second via portion disposed in the second insulating layer;
wherein the first via portion includes:
a first via part passing through the upper surface and a lower surface of the first insulating layer; and
a first-first pad disposed on an upper surface of the first via part;
wherein the second via portion includes:
a second via part passing through upper and lower surfaces of the second insulating layer;
a second pad disposed on upper surface of the second via part;
wherein a width of the first-first pad is smaller than a width of the upper surface of the first via part and a width of the lower surface of the second via part;
wherein a side surface of the first-first pad is covered by the second via part; and
wherein the first circuit pattern is connected to the first-first pad.

2. The printed circuit board of claim 1, wherein the upper surface of the first via part includes:
a first upper surface region in direct contact with a lower surface of the first-first pad;
a second upper surface region in direct contact with the lower surface of the second via part; and
a third upper surface region in direct contact with the lower surface of the second insulating layer.

3. The printed circuit board of claim 2, wherein the lower surface of the second via part includes:
a first lower surface region in direct contact with the second upper surface region of the first via part;
a second lower surface region in direct contact with an upper surface of the first-first pad; and
a third lower surface region in direct contact with the side surface of the first-first pad and disposed between the first lower surface region and the second lower surface region.

4. The printed circuit board of claim 3, wherein an overlap area in a vertical direction between the lower surface of the second via part and the upper surface of the first-first pad is 30% or more of an entire area of the lower surface of the second via part.

5. The printed circuit board of claim 3, wherein the first-first pad does not contact the second insulating layer,
wherein a planar shape of the first via part is the same as a planar shape of the first-first pad, and
wherein a planar shape of the first circuit pattern is different from the planar shape of the first via part and the first-first pad.

6. The printed circuit board of claim 5, wherein a planar shape of the second via part is the same as a planar shape of the second pad, and
wherein the planar shape of each of the second via part and the second pad is different from the planar shape of the first circuit pattern.

7. The printed circuit board of claim 3, wherein the first via part has a slope that gradually decreases in width toward the lower surface of the first insulating layer, and
wherein the second via part has a slope that gradually decreases in width toward the lower surface of the second insulating layer.

8. The printed circuit board of claim 3, comprising:
a second circuit pattern disposed on the lower surface of the first insulating layer;
a third insulating layer disposed on the lower surface of the first insulating layer; and
a third via portion disposed in the third insulating layer;
wherein the first via part includes:
a first-second pad disposed on a lower surface of the first via part and connected to the second circuit pattern:
wherein the third via part includes:
a third via part passing through upper and lower surfaces of the third insulating layer.

9. The printed circuit board of claim 8, wherein a width of the first-second pad is smaller than a width of a lower surface of the first via part and a width of an upper surface of the third via part;
wherein a side surface of the first-second pad is covered by the third via part,
wherein a planar shape of the second circuit pattern is different from a planar shape of each of the first via part, the second via part, and the first-second.

10. The printed circuit board of claim 9, wherein the third via part has an inclination that gradually increases in width toward the lower surface of the third insulating layer,
wherein a width of the lower surface of the first via part is the same as a width of an upper surface of the third via part;
wherein the lower surface of the first via part includes:
a fourth lower surface region in contact with the first-second pad; and
a fifth lower surface region in contact with the third via part.

11. The printed circuit board of claim 10,
wherein at least one center of the first via part to the third via part is not aligned with a center of the other via parts on a same vertical line.

12. The printed circuit board of claim 9, wherein the second insulating layer and the third insulating layer include a photo-curable resin (PID: Photoimageable dielectics), and
wherein the first insulating layer is a thermosetting resin.

13. The printed circuit board of claim 3, wherein a first virtual vertical line passing through a center of the first via portion is spaced apart from a second virtual vertical line passing through a center of the second via portion in a horizontal direction.

* * * * *